(12) United States Patent
Shiota et al.

(10) Patent No.: US 7,011,910 B2
(45) Date of Patent: Mar. 14, 2006

(54) HALFTONE-TYPE PHASE-SHIFT MASK BLANK, AND HALFTONE-TYPE PHASE-SHIFT MASK

(75) Inventors: Yuki Shiota, Tokyo (JP); Osamu Nozawa, Tokyo (JP); Hideaki Mitsui, Tokyo (JP); Ryo Ohkubo, Tokyo (JP)

(73) Assignee: Hoya Corporation, Tokyo (JP)

( * ) Notice: Subject to any disclaimer, the term of this patent is extended or adjusted under 35 U.S.C. 154(b) by 271 days.

(21) Appl. No.: 10/421,944

(22) Filed: Apr. 24, 2003

(65) Prior Publication Data

US 2004/0086788 A1    May 6, 2004

(30) Foreign Application Priority Data

| Apr. 26, 2002 | (JP) | ............................. 2002-127445 |
| Apr. 26, 2002 | (JP) | ............................. 2002-127454 |
| Apr. 26, 2002 | (JP) | ............................. 2002-127468 |
| Apr. 26, 2002 | (JP) | ............................. 2002-127470 |

(51) Int. Cl.
*G01F 9/00* (2006.01)

(52) U.S. Cl. ...................................................... 430/5

(58) Field of Classification Search .................... 430/5, 430/322, 394; 716/21
See application file for complete search history.

(56) References Cited

U.S. PATENT DOCUMENTS

| 5,538,816 | A  |   | 7/1996  | Hashimoto et al. |
| 6,309,780 | B1 | * | 10/2001 | Smith ............................ 430/5 |
| 6,641,958 | B1 | * | 11/2003 | Inazuki et al. ................. 430/5 |
| 6,682,860 | B1 | * | 1/2004  | Angelopoulos et al. ........ 430/5 |
| 6,730,445 | B1 | * | 5/2004  | Angelopoulos et al. ........ 430/5 |

FOREIGN PATENT DOCUMENTS

JP            2001-174973         6/2001

* cited by examiner

*Primary Examiner*—S. Rosasco
(74) *Attorney, Agent, or Firm*—Sughrue Mion, PLLC

(57) ABSTRACT

In a halftone-type phase-shift mask blank having a phase shifter film 5, the phase shifter film 5 has a phase adjustment layer 4 for primarily controlling the phase of exposure light, and a transmissivity adjustment layer 3 which is formed between a transparent substrate 2 and the phase adjustment layer 4 and primarily controls the transmissivity of exposure light. The transmissivity adjustment layer 3 has a thickness of 90 angstroms or less.

20 Claims, 14 Drawing Sheets

SECOND EMBODIMENT (Ta-Hf70Å)

COMPARATIVE EXAMPLE 1 (TaHf100Å)

FIRST EMBODIMENT

COMPARATIVE EXAMPLE

SECOND EMBODIMENT

THIRD EMBODIMENT

HALFTONE-TYPE PHASE-SHIFT MASK BLANK, AND HALFTONE-TYPE PHASE-SHIFT MASK

BACKGROUND OF THE INVENTION

1. Field of the Invention

The invention relates to a halftone-type phase-shift mask blank, a halftone-type phase-shift mask, and a method for manufacturing the same. Particularly, the invention relates to a halftone-type phase-shift mask suitable for use with an ArF excimer laser (193 nm) and an $F_2$ excimer laser (157 nm), both serving as next-generation short-wavelength exposure light sources, and to a blank serving as a raw material of the phase-shift mask.

2. Description of the Related Art

A framework for mass-producing 256-Mbit DRAM is currently established. A further increase in integration from a megabit-class packing density to a gigabit-class packing density is about to be attempted. In association with such an increase in packing density, a rule for designing an integrated circuit has become much more stringent. Occurrence of a request for a fine pattern having a line width (half pitch) of 0.10 μm or less will surely arise.

An increase in resolution of a pattern has hitherto been pursued by rendering the wavelength of the exposure light source shorter as one means for rendering a pattern finer. As a result, a KrF excimer laser (248 nm) and an ArF excimer laser (193 nm) have primarily been used as the exposure light sources of the current photolithography method.

Shortening of an exposure wavelength results in an improvement in resolution but simultaneously causes a decrease in the depth of a focus, thereby posing adverse effects, such as an increase in the burden of designing an optical system including a lens or a decrease in the safety of processes.

In order to address those problems, a phase-shift method has become employed. The phase-shift method employs a phase-shift mask as a mask for transferring a fine pattern.

The phase-shift mask is formed from, e.g., a phase-shifter section to be used for forming a pattern on a mask and a non-pattern section where no phase shifter section is present. Phases of the light rays that have passed through the phase-shifter section and the non-pattern section are shifted from each other through 180°, thereby causing optical mutual interference in the boundaries of the pattern. Thus, contrast of a transferred image is improved. The amount of phase shift φ (rad) arising in the light that passes through the phase-shifter section has been known to depend on a complex refractive index real part "n" of the phase shifter section and a film thickness "d," and the relationship defined in Equation (1) is known to stand.

$$\phi = 2\pi d(n-1)/\lambda \quad \text{(Eq. 1)}$$

Here, λ designates the wavelength of exposure light. In order to cause a 180° phase shift, the film thickness "d" merely has to be set as $$d = \lambda/\{2(n-1)\} \quad \text{(Eq. 2)}.$$

By means of the phase-shift mask, focal depth to be used for achieving a required resolution is increased. The resolution and the applicability of processes can be simultaneously improved without changing the exposure wavelength.

Practically, the phase-shift mask can be roughly divided into a total-transmission-type (Levenson-type) phase-shift mask and a halftone-type phase-shift mask by means of an optical transmission characteristic of the phase shifter section forming a mask pattern. In the case of the former phase-shift mask, the phase shifter section is identical in optical transmissivity with the non-pattern section (a light transmission section). The mask is substantially transparent to the exposure wavelength. This phase-shift mask is generally said to be effective for transferring lines and spaces. In the case of the latter halftone-type phase-shift mask, the optical transmissivity of the phase shifter section (an optical semi-transmission section) is a few percent to a few tens of percent that of the non-pattern section (optical transmission section). The latter halftone-type phase-shift mask is said to be effective for forming contact holes and isolated patterns.

As shown in FIG. 14, the halftone-type phase shift mask has a transparent substrate 2 on which are formed at least a light transmission section 7 and a halftone phase shifter section 8 having a semi-optical transmission characteristic and a phase shift function. In terms of construction of the halftone phase shifter section 8, the halftone-type phase-shift mask can be roughly divided into a single-layer-type phase-shift mask and a multilayer-type phase-shift mask. The single-layer type halftone phase-shift mask is now the mainstream, because of ease of processing. In most single-layer-type halftone phase-shift masks, the halftone phase shifter section is formed from a single-layer film made of MoSiN or MoSiON. In contrast, in the case of a multilayer-type halftone phase-shift mask, the halftone phase-shifter section is primarily formed by combination of a layer for controlling transmissivity and a layer for controlling the amount of phase shift. The multi-layer-type halftone phase-shift mask enables independent control of a polarizing characteristic typified by transmissivity and independent control of amount of phase shift (phase angle).

In association with miniaturization of an LSI pattern, in the future the wavelength of the exposure light source (i.e., exposure wavelength) is expected to become shorter from the current KrF excimer layer (248 nm) to an ArF excimer laser (193 nm) and further to an $F_2$ excimer laser (157 nm). As the wavelength of the exposure light source becomes shorter, the range of choices of materials of a halftone phase shifter section which satisfies a predetermined transmissivity and the amount of phase shift becomes narrower. In association with shortening of wavelength of the exposure light, material having high optical transmissivity is required, in view of a conventional wavelength. Consequently, there arises a problem of a decrease in etch selectivity to a quartz substrate, which would be caused at the time of processing of a pattern. The multilayer-type (two-layer film) halftone phase shifter has an advantage of easy selection of material which enables control of a phase difference and transmissivity by combination of two-layer films and an advantage of the ability to select a material which would play a role of an upper etch stopper (as described in JP-A-2001-174973). For these reasons, development of a multilayer-type (two-layer-type) halftone phase-shifter is pursued.

In association with miniaturization of an LSI pattern, in the future the wavelength of the exposure light source (i.e., exposure wavelength) is expected to become shorter from the current KrF excimer layer (248 nm) to an ArF excimer laser (193 nm) and further to an $F_2$ excimer laser (157 nm). The film of the current dominant halftone-type phase-shift mask is designed such that a portion of the halftone phase-shifter section assumes an exposure light transmissivity of around 6%. With a view toward a higher resolution, a demand for a halftone-type phase-shift mask having a higher transmissivity is now emerging. A future requirement for a transmissivity of 15% or more is said to arise. In association with shortening of wavelength of the exposure light source and an increase in transmissivity, the range of choices of materials of a halftone phase shifter section which satisfy a predetermined transmissivity and the amount of phase shift becomes narrower. Moreover, another problem is that etch selectivity to a quartz substrate becomes smaller at the time of processing of a pattern, because of the necessity for material having high optical transmissivity in association with an increase in transmissivity or because of the necessity for material having high optical transmissivity in view of a conventional wavelength, in association with shortening of wavelength of the exposure light source. A multilayer-type halftone phase shifter section of two layers or more has an advantage of easy selection of material which enables control of a phase difference and transmissivity by means of a multilayer film or by combination of two films, as well as an advantage of the ability to select, as a lower layer, material which plays a role of an upper etch stopper layer. However, when the phase-shift mask is formed into a multilayer, a difference in etching characteristic between the layers presents a problem of difficulty in effecting highly-accurate CD (critical-dimension) control operation.

Further, a manufactured phase-shift mask must diminish reflectivity of exposure light to a certain extent. In a process for inspecting the appearance of a pattern, light having a wavelength longer than the wavelength of the exposure light is used as inspection light, and inspection is performed through use of a transmission-type optical inspection system (e.g., KLA 300 series). If transmissivity is higher than the inspection wavelength [when, e.g., an exposure wavelength corresponds to the wavelength of an KrF excimer laser (248 nm), an inspection wavelength is 488 nm or 364 nm] (for example, by 40% or more), inspection becomes difficult to perform. In particular, in association with shortening of an exposure wavelength, a halftone phase shifter section having a high optical transmissivity becomes required. However, material having a high optical transmissivity has such a tendency that the rate of increase toward a longer wavelength becomes greater. The halftone phase shifter of single layer becomes more difficult to reduce the optical transmissivity to the wavelength of inspection light to a predetermined range. Moreover, in relation to the optical inspection system, an inspection method using transmitted light and reflected light has been newly developed. The transmissivity achieved at the inspection wavelength when an inspection is performed according to this method may be slightly higher than that achieved when an inspection is performed through use of only transmitted light (e.g., by 50 to 60%). However, control must be performed such that the reflectivity achieved at the inspection wavelength becomes different from that of the transparent substrate by a certain extent (e.g., by 3% or more). More specifically, in reality, a request for controlling exposure light and a reflectivity at a wavelength differing from that of the exposure light (i.e., a wavelength slightly longer than that of the exposure light) also becomes more rigorous.

When a so-called tri-tone mask having a light transmission section, a semi-optical transmission section, and a opaque section provided on the semi-optical transmission section is inspected, reflection contrast must exist between the light transmission section/the semi-optical transmission section, between the semi-optical transmission section/the opaque section, and between the light transmission section/ the opaque section. More specifically, when light reflectivity achieved at the light transmission section at the wavelength of the light source is taken as R1; light reflectivity achieved at the semi-optical transmission section at the wavelength of the light source is taken as R2; and light reflectivity achieved at the opaque section at the wavelength of the light source is taken as R3, R1<R2<R3 must stand.

A photomask is required to suppress reflectivity to exposure light to a certain extent. Among various evaluation and measurement instruments employed in a mask process, an apparatus for inspecting imperfections and extraneous matter in a mask blank and a mask and an apparatus for measuring flatness and stress employ a reflection optical system. Therefore, there also exists demand for the apparatus to have reflectivity which enables detection and measurement operation. In various pieces of evaluation and measurement apparatus employed in the mask process, the wavelength of the light source changes from one evaluation and measurement apparatus to another. Further, development of an inspection wavelength used for particle or defect inspection is pursued with a view toward employing a shorter wavelength. Therefore, the inspection wavelength changes according to whether the inspection apparatus is new or old. Examples of typical wavelengths of the light sources are as follows: wavelengths of light sources employed for particle or defect inspection of a blank are 488 nm, 364 nm; wavelengths of light sources employed for particle or defect inspection of a mask are 257 nm, 266 nm, and 364 nm; and wavelength of light sources employed for inspecting flatness and stress is 633 nm. Light sources in a wide wavelength range from a vacuum ultraviolet range to a visible range can be said to be employed. In reality, available wavelengths change from one user to another.

The surface reflectivity of a phase shifter film employed in a halftone-type phase-shift mask blank (mask) varies with reference to a wavelength. Simultaneous achievement of reflectivity within desired ranges at a plurality of wavelengths is difficult, and eventually leads to deterioration of precision in some steps of an evaluation process.

In particular, a phase shifter film of a two-layer-type halftone phase-shift mask blank (mask) having an upper phase adjustment layer and a lower transmissivity adjustment layer is liable to exhibit great variations in reflectivity, because the reflectivity of the phase shifter film plots a curve of interference potential (reflection spectrum) with reference to a wavelength, for reasons of interference arising between the light reflected from the lower layer and the light reflected from the upper layer. Difficulty is encountered in achieving a desired reflectivity over the above-mentioned wide wavelength range.

By means of combined use of the phase-shift mask, shortening of wavelength of the exposure light has been pursued. Use of an ArF excimer laser beam (193 nm) originating from argon fluoride (ArF) as shorter-wavelength light has been under review in recent years. Further, use of fluorine ($F_2$) excimer laser beam (157 nm) as light having a much shorter wavelength has also been put forth.

In association with shortening of wavelength of the light, a wavelength band to be employed is said to shift to a deep ultraviolet range and further to a vacuum ultraviolet range. In a corresponding phase-shift mask and a corresponding phase-shift mask blank, as the exposure light approaches an ultraviolet range, control of desired transmissivity becomes difficult, because many substances are susceptible to a considerable increase in the degree of light absorption within a wavelength range shorter than 250 nm, as compared with a case where the exposure light approaches from a visible range to a near ultraviolet range. In connection with setting of transmissivity of a phase shifter, in the case of, e.g., a halftone-type phase-shift mask, it is considered desirable to have the ability to control the transmissivity of exposure light from within a range from 4% to 20% at the thickness of the phase shifter film that shifts the phase of the exposure light through a predetermined angle, depending on the sensitivity of a resist and the type of a mask (e.g., a transmission type or a halftone type), both being used in transferring a pattern.

In addition to control of transmissivity at the wavelength of exposure light in use, applicability of the invention to various inspections or alignment light sources, which are used in a process for manufacturing a blank, a process for manufacturing a mask, and a process for transferring a wafer, is also important. Light whose wavelength is longer than that of exposure light is usually employed for the inspections and the alignment light source. A wavelength close to an exposure wavelength is employed in apparatus of one or two generations prior. For instance, the appearance of a pattern is inspected through use of a transmission-type imperfection inspection apparatus (e.g., an KLA 300 series) at the wavelength of inspection light. In a case where the inspection wavelength [e.g., when the wavelength of the exposure light corresponds to the wavelength of KrF excimer laser (248 nm), the inspection wavelength assumes a 488 nm or 364 nm] is excessive with respect to transmissivity (by, for example, 40% or more), difficulty in inspection arises. In many materials, as a wavelength becomes longer, transmissivity of the material becomes higher. Hence, if an attempt is made to set low the transmissivity of desired light whose wavelength is longer than the wavelength of the exposure light, such as the inspection wavelength during designing of the phase shifter, there arises a problem of occurrence of a decrease in transmissivity with respect to the exposure light.

In the meantime, in association with miniaturization of an LSI pattern, the wavelength of the exposure light source (the wavelength of exposure light) is expected to become shorter from the current wavelength corresponding to a KrF excimer laser (248 nm) to the wavelength of an ArF excimer laser (193 nm), and further to that corresponding to an $F_2$ excimer laser (157 nm). The film of the current mainstream halftone-type phase-shift mask is designed such that transmissivity of the exposure light of a halftone phase-shifter section assumes 6% or thereabouts. With a view toward attaining higher resolution, a halftone-type phase-shift mask having higher transmissivity is on its way to being requested. In the future, transmissivity of 15% or more is said to be required. In association with shortening of the wavelength of the exposure light source or an increase in transmissivity, the range of choices of materials of the halftone phase-shifter section, the materials satisfying predetermined transmissivity and the amount of phase shift, tends to become smaller. Moreover, etch selectivity to a quartz substrate becomes lower at the time of processing of a pattern, because of the necessity for material having high optical transmissivity in association with an increase in transmissivity or because of the necessity for material having high optical transmissivity in view of a conventional wavelength, in association with shortening of wavelength of the exposure light source.

Shortening of the wavelength of the exposure light and an increase in transmissivity also pose difficulty in developing and manufacturing a photomask. Responsible drawbacks will now be described.

First, in many solid materials, the degree of light absorption becomes greater as the wavelength becomes shorter. When a light transmission film material and a semi-optical transmission film material, both being used for a KrF excimer laser or an ArF excimer laser, are formed so as to assume a thickness which provides a predetermined phase angle, transmissivity of the materials approaches zero. Further, a high degree of absorption of exposure light means that the film forming the phase shifter section is correspondingly more susceptible to damage inflicted by the exposure light. Here, damage means a change in optical characteristic (i.e., transmissivity or refractive index) of the film, a change in the thickness of the film, and deterioration of the film, all stemming from imperfections which arise in a film constituting a phase shifter section by absorption of exposure light or to a split of coupling.

In addition, etch selectivity to the phase shifter film—which affects machining precision—and resistance to an oxide or alkaline used in a cleaning step during a manufacturing process must be considered in selection of film material used for forming a phase shifter section.

SUMMARY OF THE INVENTION

The invention has been conceived in consideration of the above-described situations and aims at providing a halftone-type phase-shift mask blank or a halftone-type phase-shift mask, which enables highly-accurate CD (critical-dimension) control.

Another object of the invention is to provide a halftone-type phase-shift mask blank or halftone-type phase-shift mask, which enables a reduction in surface reflectivity at a desired wavelength.

The invention also aims at providing a halftone-type phase-shift mask blank and a halftone-type phase shift mask which enable attainment of desired surface reflectivity by suppressing variations in reflectivity within a wide wavelength range from the wavelength of exposure light to 700 nm; particularly, a halftone phase-shift mask blank and a halftone phase-shift mask which are compatible with vacuum ultraviolet exposure light to ArF (having a wavelength from 140 to 200 nm) and suitable for use with an apparatus for performing various measurement and evaluation operations using a plurality of wavelengths longer than a wavelength of exposure light.

Further, the invention also aims at providing a halftone phase-shift mask blank and a halftone phase-shift mask, which are compatible particularly with shortening of a wavelength of exposure light (the wavelength of exposure light ranging from 140 to 200 nm) and which can be applied to various inspections and alignment light sources used in a process for manufacturing a blank, a process for manufacturing a mask, and a process for transferring a wafer.

Particularly, the invention aims at providing a halftone-type phase-shift mask which is compatible with shortening of wavelength of exposure light (an exposure light wavelength range from 140 to 200 nm) and an increase in transmissivity of exposure light (a transmissivity of 8 to 30%), as well as a halftone-type phase-shift mask blank which serves as a material of the mask.

(Configuration 1) A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter, wherein the phase shifter film has a phase adjustment layer for primarily controlling the phase of the exposure light, and a transmissivity adjustment layer having the function of primarily controlling transmissivity of the exposure light formed between the transparent substrate and a phase adjustment layer; and the transmissivity adjustment layer has a thickness of 90 angstroms or less.

(Configuration 2) The halftone-type phase-shift mask blank described in Configuration 1, further characterized in that the transmissivity adjustment layer has an etch selectivity of five or more to the transparent substrate.

(Configuration 3) The halftone-type phase-shift mask blank described in Configuration 1 or 2, further characterized in that the transmissivity adjustment layer has an etch selectivity of five or more to the transparent substrate when the transparent substrate is subjected to dry etching by use of a chlorine-based gas.

(Configuration 4) A halftone-type phase-shift mask manufactured through use of the halftone-type phase-shift mask blank defined in any one of Configurations 1 through 3.

(Configuration 5) A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein a range of variations in surface reflectivity of the phase shifter film is 20% or less over a range from a wavelength of the exposure light to 700 nm.

(Configuration 6) The halftone-type phase-shift mask blank described in Configuration 5, further characterized in that the phase shifter film has a phase adjustment layer for primarily controlling a phase of exposure light, and a transmissivity adjustment layer which is formed between the transparent substrate and the phase adjustment layer and has a function of controlling transmissivity of the exposure light.

(Configuration 7) The halftone-type phase-shift mask blank described in Configuration 5 or 6, further characterized in that the phase shifter film further has a reflection adjustment layer provided at the highest layer.

(Configuration 8) The halftone-type phase-shift mask blank described in Configuration 6, further characterized in that the phase adjustment layer of the phase shifter film includes metal, silicon, oxygen, and/or nitrogen.

(Configuration 9) A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein the phase shifter film has a phase adjustment layer for primarily controlling a phase of exposure light, and a transmissivity adjustment layer which is formed between the transparent substrate and the phase adjustment layer and has a function of controlling transmissivity of the exposure light; and wherein the phase shifter film also has a reflection adjustment layer provided at the highest layer.

(Configuration 10) A halftone-type phase-shift mask manufactured through use of the halftone-type phase-shift mask blank described in any one of Configurations 5 through 9.

(Configuration 11) A halftone-type phase-shift mask blank for use in manufacturing a halftone-type phase-shift mask, the mask being used in exposing and transferring a fine pattern and including a light transmission section which enables transmission of exposure light, and a phase shifter section which shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein the phase shifter section has at least one transmissivity adjustment layer having the function of primarily controlling transmissivity of exposure light, and at least one phase adjustment layer which primarily controls the phase of exposure light; and the phase adjustment layer is formed from material including at least carbon.

(Configuration 12) The halftone-type phase-shift mask blank described in Configuration 11, further characterized in that the material including carbon contains silicon and oxygen and/or nitrogen.

(Configuration 13) The halftone-type phase-shift mask blank described in Configuration 12, further characterized in that the material including carbon further contains one type or two or more types of materials selected from the group comprising metal, phosphor, and boron.

(Configuration 14) A halftone-type phase-shift mask obtained by processing, into a desired pattern, a phase shifter film of the halftone-type phase-shift mask blank defined in any one of Configurations 11 through 13.

(Configuration 15) A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein the phase shifter film is formed from a film which contains 10 atm. % or less of metal and is made primarily of metal, silicon, oxygen, and nitrogen, and an etch stopper film formed between the film and the transparent substrate.

(Configuration 16) The halftone-type phase-shift mask blank described in Configuration 15, further characterized in that the etch stopper film is formed from material which can be etched through use of an etching medium differing from that used for etching the film formed primarily from metal, silicon, oxygen, and nitrogen.

(Configuration 17) The halftone-type phase-shift mask blank described in Configuration 15 or 16, further characterized in that the etch stopper film is formed from material which can be etched through use of an etching medium identical with that used for etching the film formed primarily from metal, silicon, oxygen, and nitrogen.

(Configuration 18) The halftone-type phase-shift mask blank described in any one of Configurations 15 through 17, further characterized in that the phase-shift mask is used within an exposure light wavelength range of 140 to 200 nm.

(Configuration 19) A halftone-type phase-shift mask having a mask pattern formed by subjecting a phase shifter film of the halftone-type phase-shift mask blank defined in any one of Configurations 15 to 18 to patterning operation for selectively eliminating the phase shifter film so as to obtain a predetermined pattern.

(Configuration 20) A pattern transfer method for transferring a pattern through use of the halftone phase-shift mask defined in Configuration 19.

DESCRIPTION OF THE PREFERRED EMBODIMENTS

Figure 1:
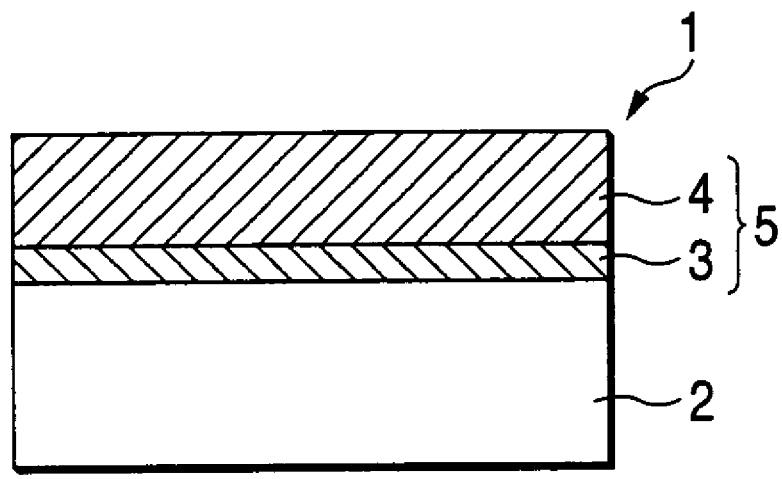
FIGS. 1A and 1B are cross-sectional views of a halftone-type phase-shift mask blank and a halftone-type phase-shift mask according to embodiments of the invention.
Figure 1:
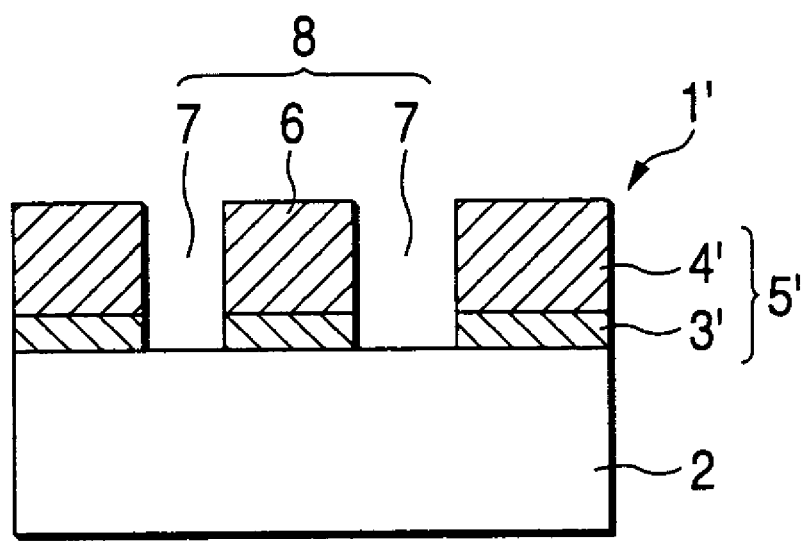

The present invention will be described in detail hereinbelow.

The invention relates to a halftone-type phase-shift mask blank, wherein a phase shifter film has at least one phase adjustment layer for primarily controlling the phase of the exposure light, and a transmissivity adjustment layer having the function of primarily controlling transmissivity of the exposure light formed between the transparent substrate and the phase adjustment layer; and wherein the transmissivity adjustment layer has a thickness of 90 angstroms or less (Configuration 1).

As mentioned above, a surface reflectivity curve can be curtailed by reducing the thickness of the transmissivity adjustment layer. The transmissivity adjustment layer is considerably thin, and the phase adjustment layer occupies much of the phase shifter film. Hence, essential CD control can be effected by means of etching the phase adjustment layer. Consequently, highly-accurate CD control can be performed.

From a similar viewpoint, the thickness of the transmissivity adjustment layer is preferably set to 80 angstroms or less, further preferably to 70 angstroms or less. In order to obtain functions corresponding to the function of the transmissivity adjustment layer, or in consideration of the role of the phase control layer as an etch stopper, the lower limit of the transmissivity adjustment layer is preferably set to 5 angstroms or more, more preferably 20 angstroms or more.

The phase adjustment layer has a function of primarily adjusting a phase and also has a function of adjusting transmissivity. The transmissivity adjustment layer has a function of primarily adjusting transmissivity and also has a function for adjusting a phase.

When a phase shift angle of exposure light required as a phase shifter film of the halftone-type phase-shift mask blank (halftone-type phase-shift mask) is taken as A (deg.), the following equation is derived, $$0<\phi2<\phi1<A(\text{deg.})$$ (Eq. 1), given that the amount of phase shift of exposure light in the phase adjustment layer is taken as $\phi1$ and that the amount of phase shift of exposure light of the transmissivity adjustment layer is taken as $\phi2$.

When there is employed a two-layer structure such that an upper layer performs the function for primarily adjusting the amount of phase shift (a phase adjustment layer) and such that a lower layer performs the function of primarily adjusting transmissivity (a transmissivity adjustment layer), the phase shifter film is designed as follows.

Specifically, when the amount of phase shift $\phi$ (deg.) in the exposure light of wavelength $\lambda$ that passes through the upper layer (phase adjustment layer) is taken as $\phi1$, the thickness "d" of the phase adjustment layer is expressed as $$d=(\phi1/360)\times\lambda/(n-1)$$ (Eq. 2), where "n" represents a refractive index of the phase adjustment layer with reference to a wavelength $\lambda$.

The phase shifter film must be designed such that the amount of phase shift $\phi$ in the halftone phase-shifter section is expressed as $$\phi=\phi1+\phi2=A(\text{deg.})$$ (Eq. 3), where the amount of phase shift in a lower layer (transmissivity adjustment layer) is taken as $\phi2$. The value of $\phi2$ generally falls within the range of $-20°\leq\phi2\leq20°$. If the value falls outside the range, the lower layer becomes too thick, thereby obstructing an increase in transmissivity of the exposure light. For this reason, the thickness "d" of the upper layer is designed so as to fall within the range defined by the following equation.

$$0.44\times\lambda/(n-1)\leq d\leq 0.56\times\lambda/(n-1)$$ (Eq. 4)

The amount of phase shift in the halftone phase shifter film ideally assumes a value of 180°. The only practical requirement is that the amount of phase shift falls within a range of 180°+5°.

In view of transfer of a pattern, a transmissivity of exposure light is desirably set to 3 to 20%, preferably to 6 to 20%; and the reflectivity of exposure light is desirably set to 30%, preferably to 20%. In order to perform inspection of imperfections through use of the light that have transmitted through the mask, the transmissivity of inspection light is preferably set to 40% or less. In order to perform inspection of imperfections through use of the light that has passed through the mask and the light that has been reflected from the mask, the transmissivity of the inspection light is preferably set to 60% or less, and the reflectivity of the inspection light is preferably set to 12% to 30%.

The reflectivity of the inspection light can be adjusted by making the refractive index of the upper film smaller than that of the lower film at the inspection wavelength. Even at the exposure wavelength, the refractive index of the upper layer becomes smaller than the refractive index of the lower film. Therefore, the reflectivity of the exposure light can also be adjusted to a requested value or less.

A film formed from one type of material or two or more types of materials selected from the group consisting of metal and silicon or oxides, nitrides, oxynitrides, and carbides thereof can be used as a material of the transmissivity adjustment layer. Specifically, a film formed from one type of material or two or more types of materials selected from the group consisting of aluminum, titanium, vanadium, chromium, zirconium, niobium, molybdenum, lanthanum, tantalum, tungsten, silicon, hafnium, or nitrides, oxides, oxynitrides, and carbides thereof can be enunciated as the material of the transmissivity adjustment layer.

A thin film—which employs as component silicon such as silicon oxide, silicon nitride, or silicon oxynitride—is preferable as the phase adjustment layer, because the film is likely to achieve a comparatively high transmissivity at exposure light in an Ultraviolet range. These materials are easy to control in terms of a refractive index, and hence the phase adjustment layer is also superior in ease of control of the phase shift angle, which is the main function of the phase shifter. Further, the principal materials of the film are silicon oxide and silicon nitride, and hence the phase shifter film is also superior in chemical resistance. Specifically, the material may include silicon, oxygen, and/or nitrogen, or may additionally include one type of material or two or more types of materials selected from the group consisting of metal, phosphor, boron, and carbon. Molybdenum, tungsten, tantalum, titanium, chromium, or other transition metals can also be enunciated as metal.

Such a phase adjustment layer can usually be etched by means of dry etching through use of a fluorine-based gas; for instance, a mixed gas of $C_xF_y$ (e.g., $CF_4$, $C_2F_6$, $C_3F_8$), $CHF_3$, and $SF_6$ or such a mixed gas additionally including as a gas additive $O_2$ or a rare gas (He, Ar, Xe) can be enunciated as fluorine-based gases.

The transmissivity adjustment layer is preferably a film serving as an etch stopper at the time of etching of the phase adjustment layer. Here, the etch stopper is a film formed from material having a function of hindering progress in etching of the phase adjustment layer, a film having the function of facilitating detection of an end point of etching of the phase shifter film, or a film formed from a material having both functions.

When the transmissivity adjustment layer is formed from a film made of material having the function of stopping a progress in etching of the phase adjustment layer, the transmissivity adjustment layer must be formed into a film which has resistance to the fluorine-based gas and enables etching through use of a gas differing from the fluorine-based gas.

In the invention, in order to enable essential control of CD through etching of a phase adjustment layer, an etch selectivity to a transparent substrate of the transmissivity adjustment layer preferably assumes a value of 5 or more. Specifically, an over-etching time can be shortened by speeding up the etch rate of the lower. Hence, the influence on the phase adjustment layer stemming from etching of the lower layer can be minimized.

In view of the ability to inhibit damage on the transparent substrate, use of a chlorine-based gas as a gas differing from the fluorine-based gas is preferable. As the chlorine-based gas there may be mentioned $Cl_2$, $BCl_3$, HCl, a gas mixture thereof, or such a gas or gas mixture provided with a rare gas (He, Ar, or Xe) as a gas additive. Fluorine gas and a gas other than fluorine can be used in combination. In that case, a gas accounting for a large proportion of excitation species of activation species in plasma is taken as a dominant gas. If fluorine excitation species are dominant, a fluorine-based gas is specified. In contrast, if chlorine-based excitation species are dominant, a chlorine-based gas is specified. When fluorine and other halogen elements are included in a single gas composition (e.g., $ClF_3$ or the like), a fluorine-based gas is taken as a dominant gas.

A material—which enables achievement of an etch selective ratio of five or more to a transparent substrate at the time of dry etching operation using a chlorine-based gas—includes the following materials. The lower layer is formed from a material (first material) including a simple metal substance selected from a first group consisting of Al, Ga, Hf, Ti, V, and Zr, or two or more thereof. Alternatively, the lower layer is formed by adding at least one type of metal selected from the first group to a material (second material) including one type of metal selected from a second group consisting of Cr, Ge, Pd, Si, Ta, Nb, Sb, Pt, Au, Po, Mo, and W. Alternatively, the lower layer is formed from a material formed by causing the single metal substance or the first/second material to include nitrogen and/or carbon.

A chlorine gas is ascertained to assume an etch selectivity of five or more with respect to Zr, Hf, TaZr, TaHf, or HfSi.

Figure 4:
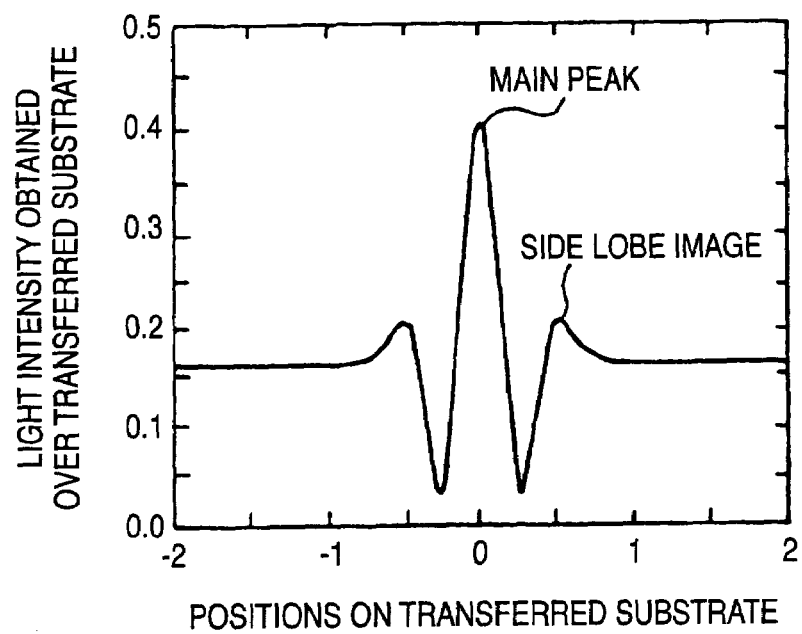
FIG. 4 is a view for describing a problem of side lobe image.
Figure 5:
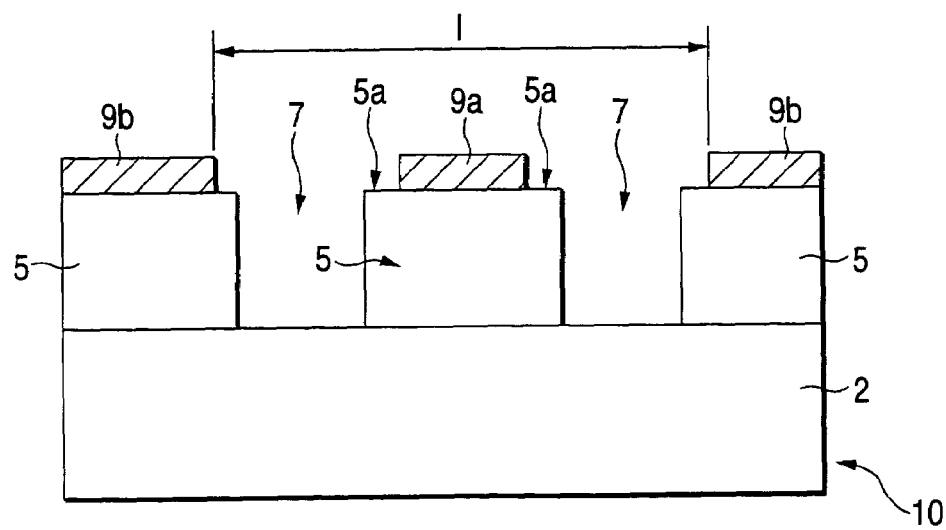
FIG. 5 is schematic representation for describing one mode of the halftone-type phase shift mask.

According to the invention, a opaque layer is formed in a desired area with exclusion of a boundary between the halftone phase shifter section and the light transmission section. As a result, there can be obtained a halftone-type phase-shift mask of so-called tri-tone type which enables highly-accurate transfer of a pattern. More specifically, an intensive light-intensity area (side lobe image) appears around a halftone phase shifter section of the halftone-type phase shift mask (FIG. 4). In some situations, resist provided on a substrate which is to be subjected to transfer (hereinafter called a "transferred substrate") is exposed. A reduction in the thickness of the resist provided on the transferred substrate stemming from exposure results in deterioration of accuracy of a pattern. In recent years, the transmissivity of the halftone phase shifter section tends to be increased, in order to sufficiently yield the effect of phase shift. In this case, the side lobe image poses a particularly large problem. Accordingly, as shown in FIG. 5, a opaque layer 9a is provided in a desired area exclusive of neighborhoods 5a of a boundary between the halftone phase shifter section 5 on the transparent substrate 2 and the light transmission section 7; that is, an area where the intensity of the side lobe image can be diminished. As a result, there can be obtained a highly-accurate transfer pattern which yields a sufficient effect of phase shift and prevents a reduction in the thickness of a resist provided on the transferred substrate. This configuration is particularly effective for a halftone-type phase-shift mask which is a highly-transmissive halftone phase shifter film having transmissivity of 8 to 30%, preferably 9 to 25%.

As shown in FIG. 5, the halftone-type phase-shift mask preferably has opaque layers 9b in a non-transfer area exclusive of a transfer area I. When a plurality of areas on the transferred substrate are exposed through use of a single mask, an object to be transferred (hereinafter called a "transferred object") is subjected to multiple exposure in overlaps between exposure areas, thereby preventing occurrence of a reduction in thickness of the resist on the transferred substrate.

A synthetic quartz substrate or the like can be used as a transparent substrate of the invention. Particularly, when an $F_2$ excimer laser is used as exposure light, an F-doped synthetic quartz substrate or a calcium fluoride substrate can be used.

The invention will be described in detail hereinbelow through use of embodiments and a comparative example. However, the invention is not limited to the embodiments.

Figure 2:
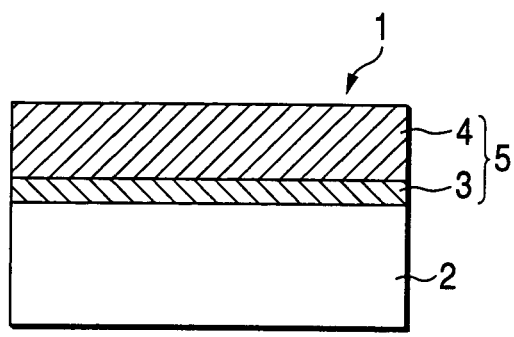
FIGS. 2A–2D are charts pertaining to a process of manufacturing the halftone-type phase-shift mask blank and the halftone-type phase-shift mask according to the embodiments of the invention.
Figure 2:
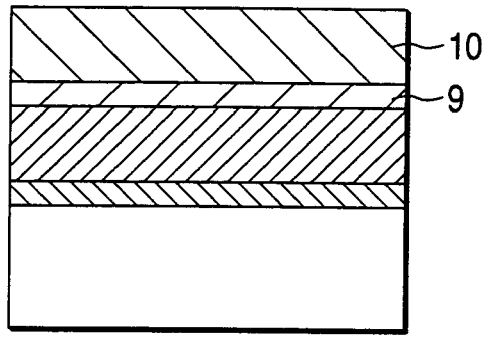
Figure 2:
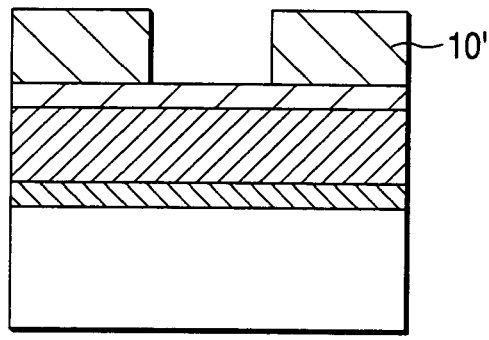
Figure 2:
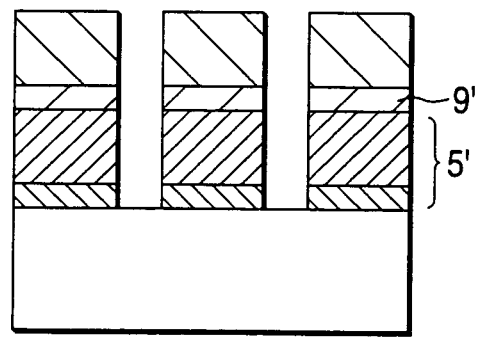

FIG. 1—1 shows a schematic cross-section of a halftone-type phase-shift mask blank according to the embodiments of the invention and a comparative example, and FIG. 1-2 shows a schematic cross-section of a halftone-type phase-shift mask according to the embodiments of the invention and the comparative example.

In FIG. 1—1, the halftone-type phase-shift mask blank 1 is formed from a transparent substrate 2 and a halftone phase shifter film 5 provided thereon, wherein the halftone phase shifter film 5 is formed from a lower layer 3, and an upper layer 4 provided immediately above the lower layer 3.

In FIGS. 1–2, a halftone-type phase-shift mask 1' is formed from a transparent substrate 2, and a halftone phase shifter film section 5' provided thereon, wherein the halftone phase shifter film section 5' is formed from a lower layer section 3', and an upper layer section 4' provided immediately above the lower layer section 3'. A mask pattern 8 is formed in the halftone-type phase shift mask 1', wherein the pattern is formed from semi-optical transmission sections 6 where the halftone phase shifter section is formed, and light transmission sections 7 where no halftone phase shifter sections are formed. The halftone phase shifter films 5 and 5' have a desired transmissivity with respect to exposure light and are placed so as to form an angle of about 180° with reference to exposure light. The halftone phase shifter films are designed such that a transmissivity obtained at an inspection wavelength or a transmissivity and a reflectivity fall within a desired range.

(Manufacture of Halftone-Type Phase-Shift Mask Blank)

A manufacturing process of the invention will now be described by reference to FIG. 2.

First, a transmissivity adjustment layer 3 which is formed from TaHf and has a thickness of 60 angstroms (a first embodiment), a transmissivity adjustment layer 3 of 70 angstroms (a second embodiment), a transmissivity adjustment layer 3 of 80 angstroms (a third embodiment), and a transmissivity adjustment layer 3 of 90 angstroms (a fourth embodiment) are grown on the transparent substrate 2 formed from synthetic quartz through use of a target formed from tantalum and hafnium [Ta:Hf=9:1 (atomic ratio)] and a DC magnetron sputtering system while a rare gas (argon gas) is used as a sputtering gas.

Next, an SiON film is formed immediately on the lower layer 3 through use of the DC magnetron sputtering system according to a reactive sputtering method in which Si is taken as a target and Ar, $O_2$, and $N_2$ are taken as an atmospheric sputtering gas, thereby forming a phase adjustment layer 4 made of $SiO_xN_y$ (FIG. 2-1).

The halftone-type phase-shift mask blank is subjected to heat treatment for an hour at 400° C. In the embodiment, a phase shifter film formed from the transmissivity adjustment layer and the phase adjustment layer is designed so as to assume a transmissivity of 6% and a phase shift of about 180° at a wavelength of 157 rim, which is a wavelength of the $F_2$ excimer laser.

For comparison, a halftone-type phase-shift mask blank (a comparative example 1) is obtained in the same manner as mentioned above, except that the transmissivity adjustment layer obtained in the embodiment is formed to a thickness of 100 angstroms and that the phase shifter film formed from the transmissivity adjustment layer and the phase adjustment layer is designed so as to assume a transmissivity of 6% and a phase shift of about 180° with respect to a wavelength of 157 nm, which is a wavelength of the $F_2$ excimer laser.

Figure 6:
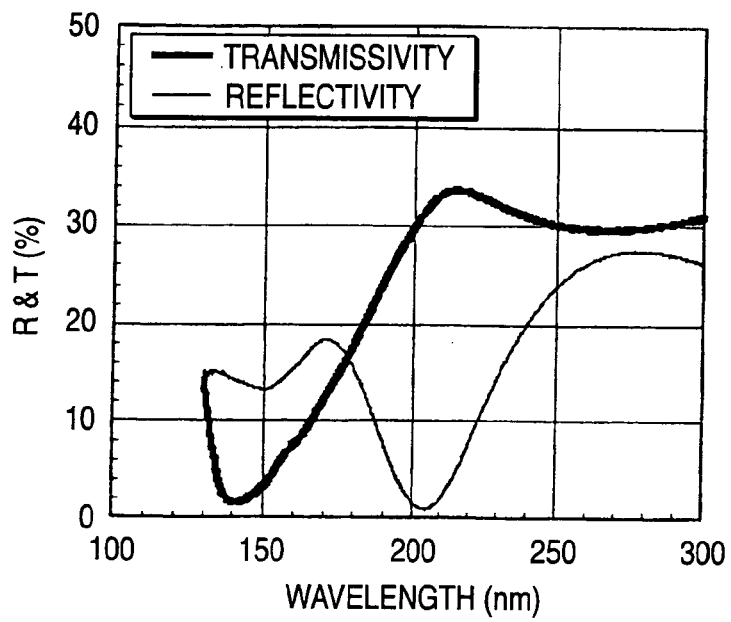
FIG. 6 is an optical characteristic spectrum chart of a halftone-type phase-shift mask blank according to a second embodiment of the invention.
Figure 7:
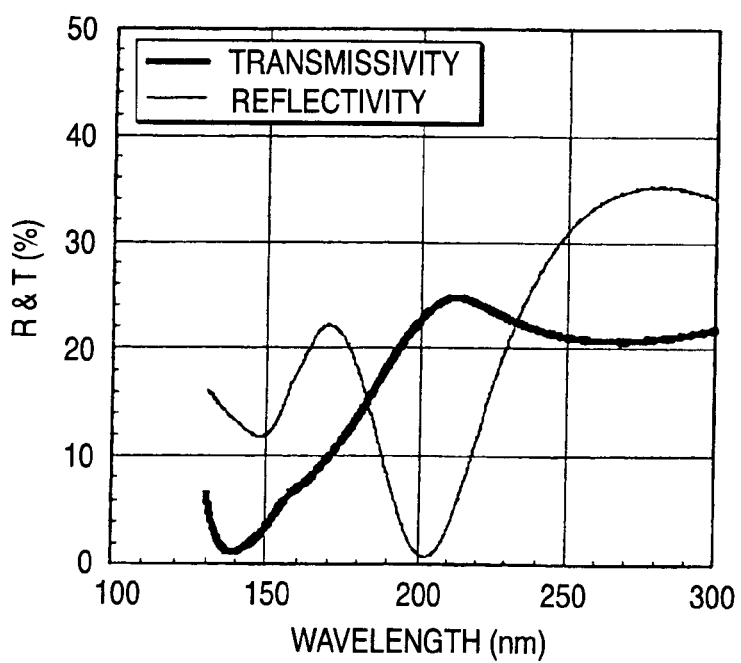
FIG. 7 is an optical characteristic spectrum chart of a halftone-type phase-shift mask blank according to a comparative example 1 of the invention.

FIG. 6 shows a transmissivity and surface reflectivity of the halftone phase-shift mask blank according to the second embodiment. FIG. 7 shows a transmissivity and surface reflectivity of the halftone phase-shift mask blank according to the comparative example 1. As is evident from the drawings, the halftone phase-shift mask blank having the transmissivity adjustment layer of 70 angstroms produces amplitudes of a reflectivity curve smaller than those produced by the halftone phase-shift mask blank having the transmissivity adjustment layer of 100 angstroms. Consequently, in the case of the halftone phase-shift mask blank having the transmissivity adjustment layer of 70 angstroms, the reflectivity can be reduced to 30% or less over a wide wavelength range. Even the halftone-type phase-shift mask blanks of the first, third, and fourth embodiments can also reduce the reflectivity to 30% or less over the wide wavelength range. In the case of the halftone-type phase-shift mask blank of the comparative example 1, the wavelength range over which reflectivity assumes a value of 30% or less is narrow. For instance, when a wavelength of 257 nm is used as an inspection wavelength, a reflectivity becomes too high.

(Manufacture of Halftone-Type Phase-Shift Mask)

Figure 3:
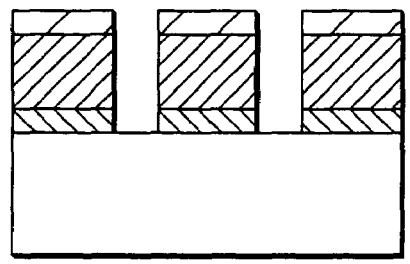
FIGS. 3A–3D are (continued) charts pertaining to a process of manufacturing the halftone-type phase-shift mask blank and the halftone-type phase-shift mask according to the embodiments of the invention.
Figure 3:
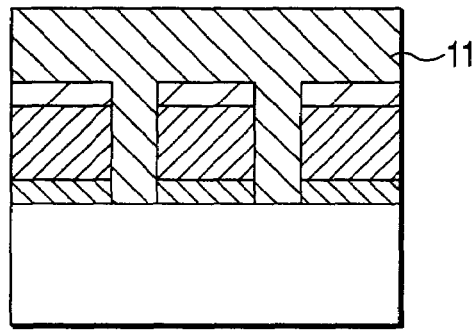
Figure 3:
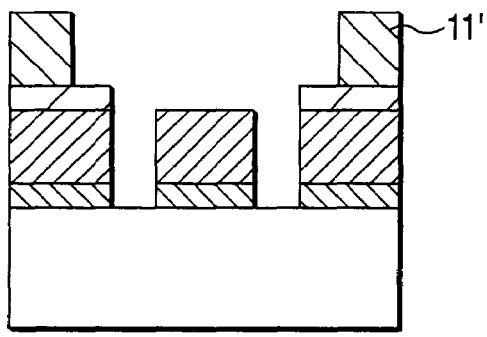
Figure 3:
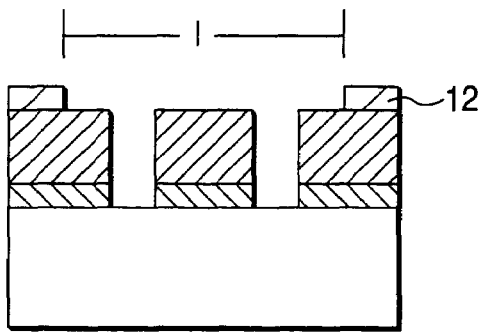

Next, a opaque film 9 predominantly formed from chromium, and an electron beam lithography resist 10 are stacked sequentially on the two-layer film produced in the first through fourth embodiments shown in FIG. 2-1 and the comparative example 1 (FIG. 2—2). After a pattern has been drawn on the resist through use of an electron beam, the resist is subjected to development and baking according to the immersion method, thereby forming a resist pattern 10' (FIG. 2-3). Subsequently, a opaque ring film pattern 9' is formed through dry etching in a $Cl_2+O_2$ gas while the resist pattern is used as a mask. In addition, a pattern of the phase shifter section is formed by changing a gas. At that time, a $CF_4+O_2$ gas is used for etching the phase adjustment layer 4, and a $Cl_2$ gas is used for etching the transmissivity adjustment layer 3 (FIG. 2-4). An etch selectivity ratio to the transparent substrate of the transmissivity adjustment layer formed from TaHf is a value of five or less.

Next, the resist formed on the pattern is exfoliated (FIG. 3-1), and resist 11 is again applied over the entire surface of the pattern (FIG. 3-2). The resist is then subjected to a laser lithography-and-development process, thereby forming a resist pattern 11' (FIG. 3—3). By means of wet etching, a opaque swath 12 is formed over non-transfer areas exclusive of the transfer area 1. Subsequently, the resist pattern is exfoliated, thereby providing a halftone-type phase-shift mask (FIG. 3-4).

The phase shifter section of the first through fourth embodiments is superior to that obtained in the comparative example 1 in terms of ease of CD control.

The invention will now be described in detail hereinbelow.

The invention is characterized in that a range of variations in surface reflectivity of the phase shifter film of the phase-shift blank is 20% or less over the range from the wavelength of exposure light to 700 nm. Accordingly, when the wavelength of the exposure light is 157 nm, the range of variations in surface reflectivity is 157 nm to 700 nm. When the wavelength of the exposure light is 193 nm, the range of variations in surface reflectivity is 193 nm to 700 nm. The reason why a wavelength of 700 nm is selected is that most pieces of evaluation/inspection apparatus employ a wavelength of 700 nm or less.

By means of employing such a range of variations, there can be obtained reflectivity which falls within a range applicable to a plurality of radiation light rays, such as exposure light, inspection light, light used for inspecting flatness or stress, and alignment light.

The minimum reflectivity of the phase shifter film within the range from the wavelength of the exposure light to 700 nm is preferably set to a value of 5% or more, more preferably a value of 8% or more, in view of the sensitivity to detect reflected light. In consideration of contrast with the substrate, the minimum reflectivity is preferably set to a value of 10% or more. Even when a reflectivity is too high, the detection sensitivity becomes undesirably too high. In view of practicality, the maximum reflectivity within the same wavelength range is preferably 40% or less, more preferably 30% or less. Specifically, the reflectivity preferably falls within the range of 8% to 40% over the range from the wavelength of the exposure light to 700 nm. Most preferably, the reflectivity falls within the range of 10% to 30%.

In consideration of inspection using transmitted light, the transmitted light preferably assumes a value of 40% or less over the range from the wavelength of the exposure light to 400 nm. In particularly, the transmitted light preferably assumes a value of 40% or less over the range from 200 nm to 370 nm including a wavelength used for particle or defect inspection.

According to the invention, in order to make the wavelength of the halftone phase-shift mask blank shorter (140 nm to 200 nm); specifically, to obtain a blank suitable for use with a wavelength of 193 nm, which is a wavelength of the ArF excimer laser, and a wavelength of 157 nm, which is a wavelength of the $F_2$ excimer laser, the phase shifter film preferably has the phase adjustment layer for primarily controlling the phase of exposure light, and a transmissivity adjustment layer which is formed between the transparent substrate and the phase adjustment layer and has the function of primarily controlling the transmissivity of the exposure light.

The phase adjustment layer has the function of primarily adjusting a phase and also has the function of adjusting transmissivity. In contrast, the transmissivity adjustment layer has the function of primarily adjusting transmissivity and also has the function of adjusting a phase.

When the phase shift angle of the exposure light requested at a phase shifter film of the halftone-type phase-shift mask blank (a halftone-type phase-shift mask) is taken as A (deg.), there can be derived a relationship $$0<\phi 2<\phi 1<A(\deg.) \tag{Eq. 1},$$

provided that the amount of phase shift in the exposure light caused by the phase adjustment layer is taken as $\phi 1$ and the amount of phase shift in the exposure light caused by the transmissivity adjustment layer is taken as $\phi 2$.

When there is employed a two-layer structure such that an upper layer performs the function for primarily adjusting the amount of phase shift (a phase adjustment layer) and such that a lower layer performs the function of primarily adjusting transmissivity (a transmissivity adjustment layer), the phase shifter film is designed as follows.

Specifically, the amount of phase shift $\phi$ (deg.) in the exposure light of wavelength λ that passes through the upper layer (phase adjustment layer) is taken as $\phi 1$, the thickness "d" of the phase adjustment layer is expressed as $$d=(\phi 1/360)\times \lambda /(n-1) \tag{Eq. 2},$$

where "n" represents a refractive index of the phase adjustment layer with reference to a wavelength λ.

The phase shifter film must be designed such that the amount of phase shift $\phi$ in the halftone phase-shifter section is expressed as $$\phi =\phi 1+\phi 2=A(\deg.) \tag{Eq. 3},$$

given that the amount of phase shift in a lower layer (transmissivity adjustment layer) is taken as $\phi 2$. The value of $\phi 2$ generally falls within the range of $-20°\leq\phi 2\leq 20°$. If the value falls outside the range, the lower layer becomes too thick, thereby obstructing an increase in transmissivity of the exposure light. For this reason, the thickness "d" of the upper layer is designed so as to fall within the range defined by the following equation.

$$0.44\times\lambda/(n-1)\leq d\leq 0.56\times\lambda/(n-1) \quad\text{(Eq. 4)}$$

The amount of phase shift in the halftone phase shifter film ideally assumes a value of 180°. The only practical requirement is that the amount of phase shift falls within a range of 180°±5°.

In view of transfer of a pattern, a transmissivity of exposure light is desirably set to 3% to 20%, preferably to 6% to 20%; and the reflectivity of exposure light is desirably set to 30%, preferably to 20%.

The reflectivity of the inspection light can be adjusted by making the refractive index of the upper film smaller than that of the lower film at the inspection wavelength. Even at the exposure wavelength, the refractive index of the upper layer becomes smaller than the refractive index of the lower film. Therefore, the reflectivity of the exposure light can also be adjusted to a requested value or less.

A film formed from one type of material or two or more types of materials selected from the group consisting of metal and silicon or oxides, nitrides, oxynitrides, and carbides thereof can be used as a material of the transmissivity adjustment layer. Specifically, a film formed from one type of material or two or more types of materials selected from the group consisting of aluminum, titanium, vanadium, chromium, zirconium, niobium, molybdenum, lanthanum, tantalum, tungsten, silicon, hafnium or nitrides, oxides, oxynitrides, and carbides thereof can be enunciated as the material of the transmissivity adjustment layer.

A thin film—which employs as a matrix component silicon such as silicon oxide, silicon nitride, or silicon oxynitride—is preferable, because the film is likely to achieve a comparatively-high transmissivity at exposure light in an Ultraviolet region. These materials are easy to control in terms of a refractive index, and hence the phase adjustment layer is also superior in ease of control of the phase shift angle, which is the main function of the phase shifter. Further, the principal materials of the film are silicon oxide and silicon nitride, and hence the phase shifter film is also superior in chemical resistance. Specifically, the material may include silicon, oxygen, and/or nitrogen, or additionally include one type of material or two or more types of materials selected from the group consisting of phosphor, boron, and carbon.

Such a phase adjustment layer can usually be etched by means of dry etching through use of a fluorine-based gas; for instance, a mixed gas of $C_xF_y$ (e.g., $CF_4$, $C_2F_6$, $C_3F_8$), $CHF_3$, and $SF_6$ or such a mixed gas additionally including as a gas additive $O_2$ or a rare gas (He, Ar, Xe) can be enunciated as a fluorine-based gas.

The transmissivity adjustment layer is preferably a film serving as an etch stopper at the time of etching of the phase adjustment layer. Here, the etch stopper is a film formed from material having a function of hindering a progress in etching of the phase adjustment layer, a film having the function of facilitating detection of an end point of etching of the phase shifter film, or a film formed from material having both functions.

When the transmissivity adjustment layer is formed from a film made of material having the function of stopping a progress in etching of the phase adjustment layer, the transmissivity adjustment layer must be formed into a film which has resistance to the fluorine-based gas and enables etching through use of a gas differing from the fluorine-based gas.

In view of the ability to inhibit damage on the transparent substrate, use of a chlorine-based gas as a gas differing from the fluorine-based gas is preferable. As the chlorine-based gas there may be mentioned $Cl_2$, $BCl_3$, HCl, a gas mixture thereof, or such a gas or gas mixture provided with a rare gas (He, Ar, or Xe) as a gas additive. Fluorine gas and a gas other than fluorine can be used in combination. In such a case, a gas accounting for a large proportion of excitation species of activation species in plasma is taken as a dominant gas. If fluorine excitation species are dominant, a fluorine-based gas is specified. In contrast, if chlorine-based excitation species are dominant, a chlorine-based gas is specified. When fluorine and other halogen elements are included in a single gas composition (e.g., $ClF_3$ or the like), a fluorine-based gas is taken as a dominant gas.

In order to enable essential control of CD through etching of a phase adjustment layer, an etch selectivity to a transparent substrate of the transmissivity adjustment layer assumes a value of 5 or more. More specifically, an over-etch time can be suppressed to a short period of time by increasing the etch rate of the lower layer. As a result, the influence to the phase adjustment layer by etching of the lower layer can be minimized.

A material—which enables achievement of an etch selective ratio of five or more to a transparent substrate at the time of dry etching operation using a chlorine-based gas—includes the following materials. The lower layer is formed from a material (first material) including a simple metal substance selected from a first group consisting of Al, Ga, Hf, Ti, V, and Zr, or two or more types thereof. Alternatively, the lower layer is formed by adding at least one type of metal selected from the first group to a material (second material) including one type of metal selected from a second group consisting of Cr, Ge, Pd, Si, Ta, Nb, Sb, Pt, Au, Po, Mo, and W. Alternatively, the lower layer is formed from a material formed by causing the single metal substance or the first/second material to include nitrogen and/or carbon.

Particularly, a chlorine gas assumes an etch selectivity of five or more with respect to Zr, Hf, TaZr, TaHf, or HfSi. Hence, the chlorine gas is preferable, because the gas can suppress the over-etch time to a short period of time.

The invention includes a mode in which the phase shifter film has a phase adjustment layer for primarily controlling a phase of exposure light, and a transmissivity adjustment layer which is formed between the transparent substrate and the phase adjustment layer and has a function of controlling transmissivity of the exposure light, and the phase shifter film also has a reflection adjustment layer provided at the highest layer (Mode 1). By means of such a configuration, a reflection spectrum of the phase shifter film can be broadened (planarized).

Here, the reflection adjustment layer also has the function of adjusting a phase and the function of adjusting a transmissivity. When a phase difference in the reflectivity adjustment layer is taken as $\phi 3$, Equation 3 is rewritten as $$\phi=\phi 1+\phi 2+\phi 3=A(\text{deg.}) \quad\text{(Eq. 5)}.$$

The phase shifter film is designed in consideration of transmissivity of the reflectivity adjustment layer.

A material formed from one type of element or two or more types of elements selected from the group consisting of metal and silicon, or oxides and nitrides thereof can be used as a material of the reflectivity adjustment layer. Specifically, a material formed from one type of element or two or more types of elements selected from the group consisting of chromium, tantalum, and silicon or oxides and nitrides thereof can be enunciated as the material of the reflectivity adjustment layer. In order to avoid complication of a processing process, a material is preferably selected in consideration of an etching characteristic, such as the ability to be etched with the phase adjustment layer or the ability to be etched with the opaque film usually formed on the phase shifter film.

The thickness of the reflectivity adjustment layer is preferably set to 10 to 100 angstroms. If the reflectivity adjustment layer is thinner than 10 angstroms, a sufficient effect of broadening a reflection spectrum cannot be obtained. If the reflectivity adjustment layer is thicker than 100 angstroms, the reflectivity becomes too high.

The invention also includes another mode in which the phase shifter film has a phase adjustment layer which primarily controls the phase of exposure light, and a transmissivity adjustment layer which is formed between the transparent substrate and the phase adjustment layer and has the function of primarily controlling transmissivity of exposure light, and in which the phase adjustment layer is formed from material including metal, silicon, and oxygen and/or nitrogen (Mode 2). By means of such a configuration, a reflection spectrum of the phase shifter film can be broadened (planarized).

Molybdenum, tungsten, tantalum, titanium, chromium, or other transition metals can be enunciated as metal. A metal content is preferably set to 1 atm. % to 7 atm. %, more preferably 2 atm. % to 5 atm. %. When the metal content falls below the lower limit, a sufficient effect of broadening a reflection spectrum cannot be achieved. In contrast, when the metal content exceeds the upper limit, the transmissivity will decrease, thereby posing difficulty in controlling the transmissivity of the exposure light.

The invention is not limited to Modes 1 and 2. For instance, the invention encompasses a halftone phase-shift mask in which the range of variations in surface reflectivity of the phase shifter film assumes a value of 20% or less over the range from the wavelength of the exposure light to 700 nm by means of adjusting the thickness of the transmissivity adjustment layer, that of the phase adjustment layer, and materials thereof.

In the invention, a synthetic quartz substrate or the like can be used as a transparent substrate. Particularly, when the $F_2$ excimer laser is used as exposure light, an F-doped synthetic quartz substrate, a calcium fluoride substrate, or the like can be used.

The invention will be described in detail hereunder by reference to embodiments.

(Third Embodiment)

The invention provides a method of manufacturing a mask corresponding to $F_2$ excimer laser exposure light from among the halftone phase-shift masks of the invention.

A Ta—Hf film is grown to a thickness of 35 angstroms on a fluorine-doped quartz substrate (a $CaF_2$ substrate is also available) through use of a Ta—Hf alloy target [Ta:Hf=9:1 (atomic ratio)] while Ar is taken as a sputtering gas. Next, an SiON film is grown to a thickness of 780 angstroms through use of an Si target and by taking Ar, $O_2$, $N_2$ as sputtering gases and regulating the flow rate of the gases such that a refractive index "n" of 2.0 and an extinction coefficient "k" of 0.25 are achieved at a wavelength of 157 nm. Finally, a Ta film is grown to a thickness of 35 angstroms through use of a Ta target and by taking Ar as a sputtering gas, thereby producing a phase shifter film.

Figure 8:
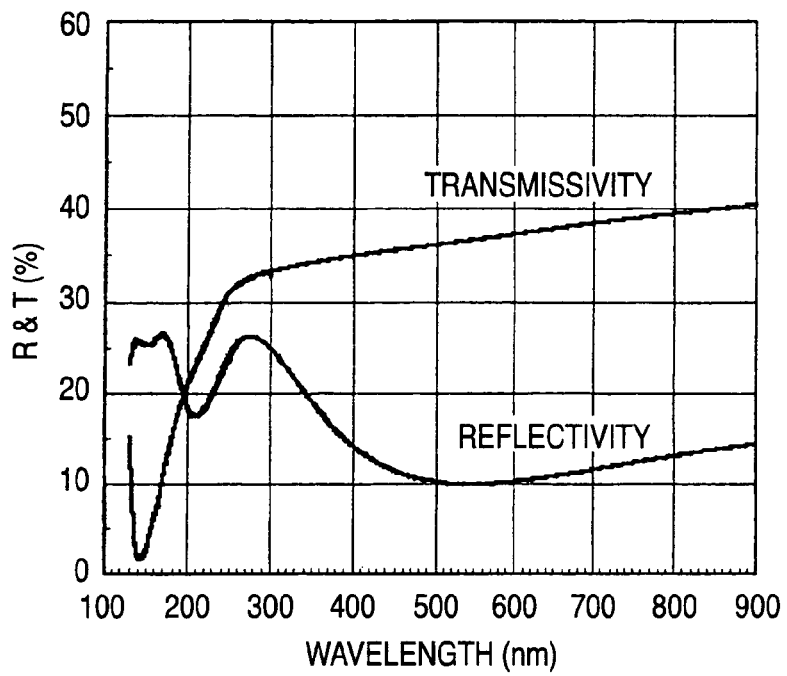
FIG. 8 is a view showing transmission/reflection spectra of a halftone-type phase-shift mask blank prepared in a third embodiment.

FIG. 8 shows transmission and reflection spectra of the phase shifter film formed through the foregoing film growth method. The reflectivity of the phase shifter film is ascertained to achieve 10 to 30% over a wide wavelength range of 140 nm to 800 nm. Naturally, the reflectivity is ascertained to fall within the range of 10 to 30% over the wavelength range of 157 nm to 700 mm. The phase shifter film achieves an optical transmissivity of 6.1% at a wavelength of 157.6 nm, which is a wavelength of an $F_2$ excimer laser.

The phase shifter film is subjected to inspection of imperfections and extraneous matter at a light source of 488 nm, whereby superior measurement sensitivity and superior measurement reproducibility are achieved.

Figure 12:
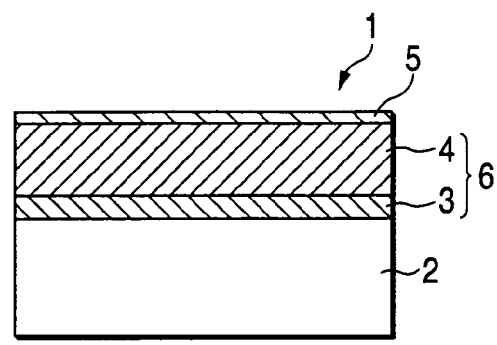
FIGS. 12A–12D are charts pertaining to a process of manufacturing the halftone-type phase-shift mask blank and the halftone-type phase-shift mask according to the embodiment of the invention.
Figure 12:
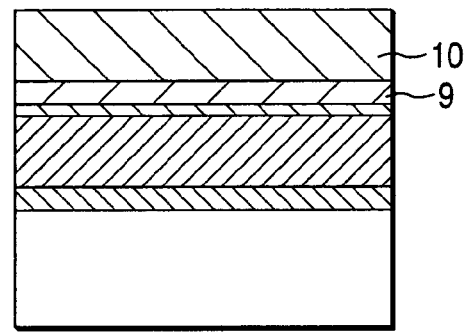
Figure 12:
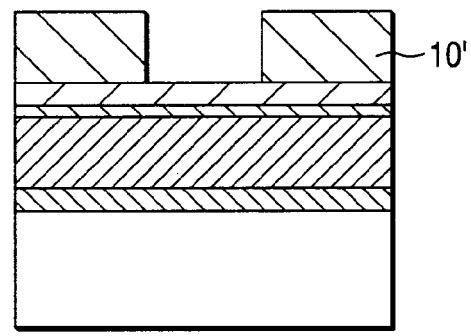
Figure 12:
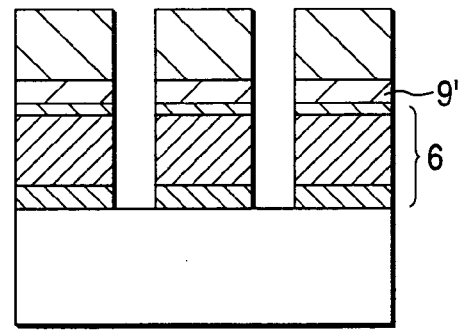

As shown in FIG. 12-1, the opaque film 9 predominantly formed from chromium, and the electron beam lithography resist 10 are stacked sequentially on the transparent substrate 2 formed from a fluorine-doped quartz substrate with the phase shifter film 6 sandwiched therebetween, which consists of the transmissivity adjustment layer 3 made of Ta—Hf, the phase adjustment layer 4 made of SiON, and the reflectivity adjustment layer 5 made of Ta (FIG. 12-2).

After a pattern has been drawn on the resist 10 through use of the electron beam, the resist is subjected to development and baking according to the immersion method, thereby forming the resist pattern 10' (FIG. 12-3). Subsequently, a pattern is formed in the opaque ring 9 through dry etching in a $Cl_2+O_2$ gas while the resist pattern 10' is used as a mask. In addition, a pattern is formed in the phase shifter film 6 by changing a gas while the opaque swath film 9 is taken as a mask (FIG. 12-4). In the embodiment, the reflectivity adjustment layer 5 and the phase adjustment layer 4 are etched in a $CF_4+O_2$ gas. Subsequently, the transmissivity adjustment layer 3 is etched in a $Cl_2$ gas. An end point of etching operation is detected by means of a reflected light scheme. End points of the respective layers are determined by means of points of inflection of a reflected light intensity profile. Through observation of cross-sectional profile of the patterned phase shifter film, a vertical cross section is observed.

Figure 13:
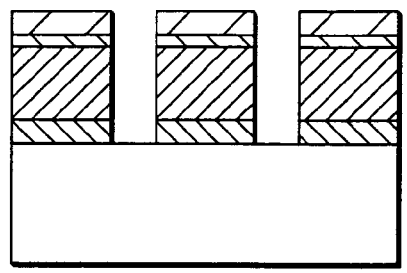
FIGS. 13A–13D are (continued) charts pertaining to a process of manufacturing the halftone-type phase-shift mask blank and the halftone-type phase-shift mask according to the embodiment of the invention.
Figure 13:
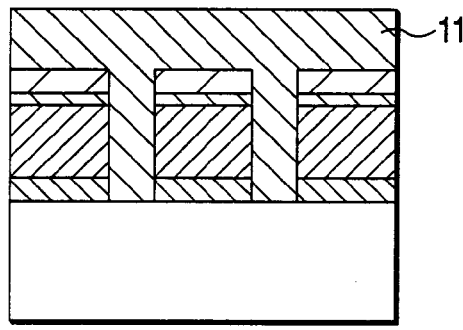
Figure 13:
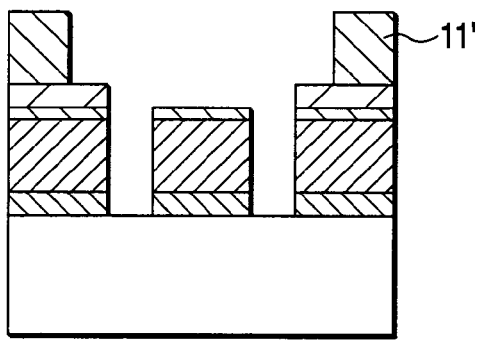
Figure 13:
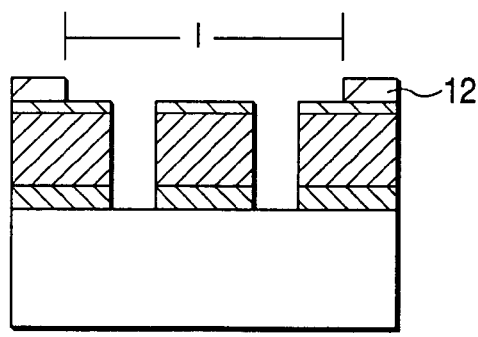
Figure 14:
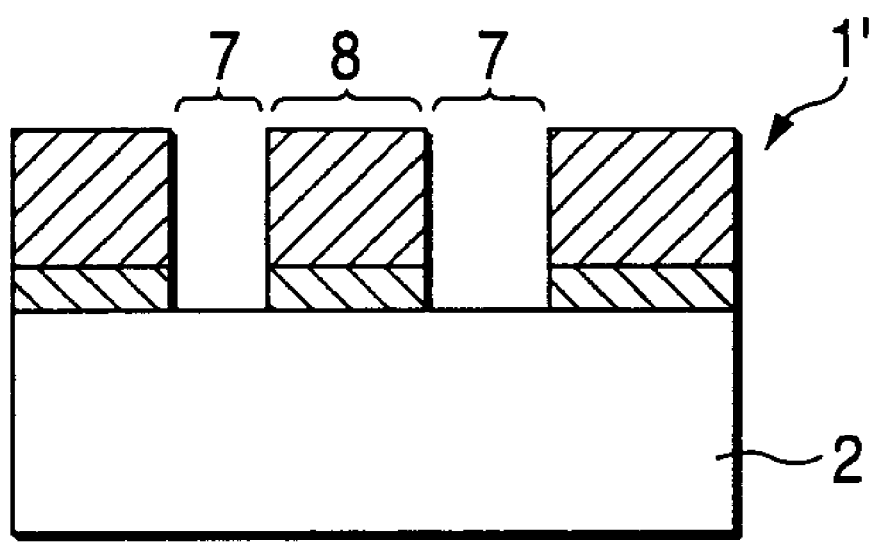
FIG. 14 is a schematic representation for describing one mode of the halftone-type phase shift mask.

Next, the resist formed on the pattern is exfoliated (FIG. 13-1), and the resist 11 is again applied over the entire surface of the pattern (FIG. 13-2). The resist is then subjected to a laser lithography-and-development process, thereby forming a resist pattern 11' along the peripheral edge of the mask pattern (FIG. 13-3). By means of wet etching or dry etching, Cr is removed with exception of Cr located below the resist patterns 11', whereby the opaque swath 12 is formed over non-transfer areas exclusive of the transfer area I. Thus, the half tone-type phase-shift mask is obtained (FIG. 13-4). A phase difference between the light transmission section of the mask and the halftone phase shifter section is measured through use of a phase-contrast instrument. The resultant phase difference at the wavelength of the exposure light is 180°.

The halftone phase-shift mask obtained in the third embodiment is subjected to inspection of imperfection and extraneous matter at light source wavelengths of 257 nm and 364 nm (Starlight, Terascan, or the like), and flatness measurement (TROPEL) at a light source wavelength of 633 nm. As a result, superior measurement sensitivity and measurement reproducibility are obtained.

COMPARATIVE EXAMPLE

Figure 9:
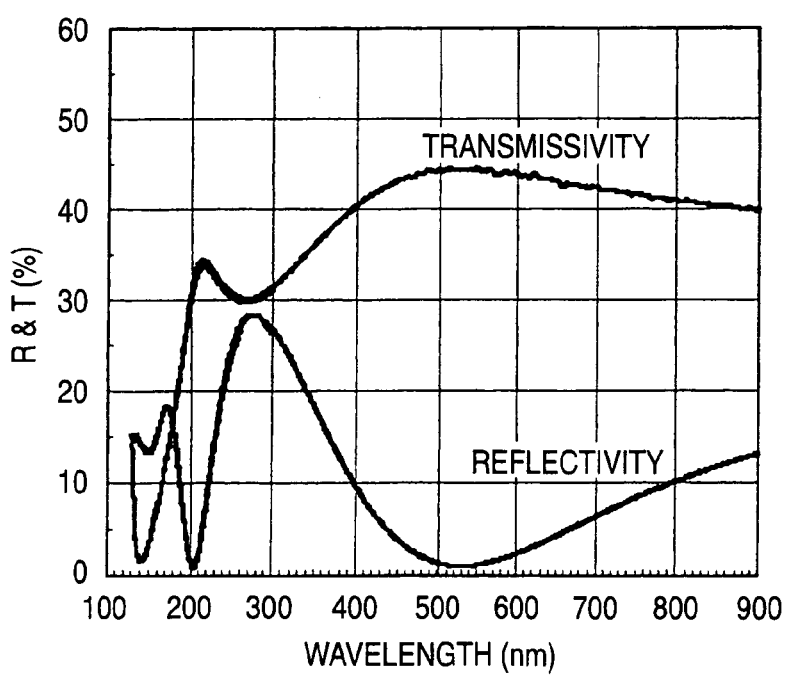
FIG. 9 is a view showing transmission/reflection spectra of a halftone-type phase-shift mask blank prepared in the comparative example.

FIG. 9 shows transmission and reflection spectra of the phase shifter film obtained when the reflectivity adjustment layer of the third embodiment is not obtained and when the transmissivity adjustment layer is set to a thickness of 70 angstroms.

No change arises in transmissivity and phase angle at a wavelength of 157.6 nm, which is the wavelength of the $F_2$ excimer laser. Wavelength variations arising in reflectivity are great, and a nominal reflectivity of 1.5% is achieved at a wavelength of 488 nm. The phase shifter film is subjected to particle or defect inspections at the light source wavelength of 488 nm several times. However, sufficient detection sensitivity is not attained. Further, reproducibility is not observed in the distribution of particle sizes.

(Fourth Embodiment)

The invention provides a method of manufacturing a mask corresponding to ArF excimer laser exposure light from among the halftone phase-shift masks of the invention.

A Ta—Hf film is grown to a thickness of 35 angstroms on a synthetic quartz substrate through use of a Ta—Hf alloy target, which is the same as that employed in the third embodiment, while Ar is taken as a sputtering gas. Next, an SiON film is grown to a thickness of 840 angstroms through use of a Si target and by taking Ar, $O_2$, $N_2$ as sputtering gases and regulating the flow rate of the gases such that a refractive index "n" of 2.1 and an extinction coefficient "k" of 0.12 are achieved at a wavelength of 157 nm. Finally, a Ta film is grown to a thickness of 30 angstroms through use of a Ta target and by taking Ar as a sputtering gas, thereby producing a phase shifter film.

Figure 10:
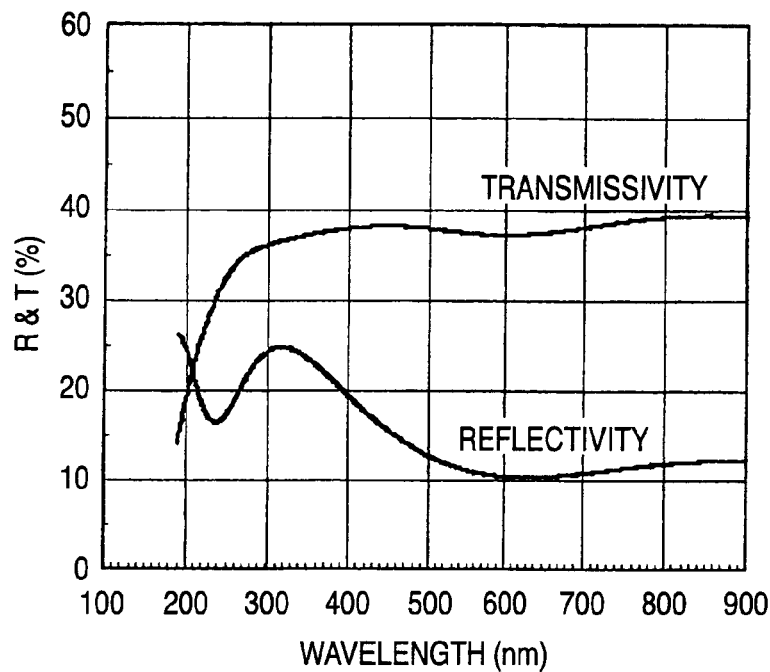
FIG. 10 is a view showing transmission/reflection spectra of a halftone-type phase-shift mask blank prepared in a fourth embodiment.

FIG. 10 shows transmission and reflection spectra of the phase shifter film formed through the foregoing film growth method. The reflectivity of the phase shifter film is ascertained to achieve 10 to 30% over a wide wavelength range of 140 nm to 800 nm. Naturally, the reflectivity is ascertained to fall within the range of 10 to 30% over the wavelength range of 193 nm to 700 nm. The phase shifter film achieves an optical transmissivity of 15.2% at a wavelength of 193 nm, which is a wavelength of an ArF excimer laser.

Subsequently, the mask pattern and the opaque ring film are formed in the same manner as in the first embodiment, thereby producing a halftone phase-shift mask. A phase difference between the light transmission section of the mask and the phase shifter section is measured through use of a phase-contrast instrument. The resultant phase difference at the wavelength of the exposure light is 180°.

The halftone phase-shift mask obtained in the fourth embodiment is subjected to particle or defect inspections at light source wavelengths of 257 nm and 364 nm (Starlight, Terascan, or the like), and flatness measurement (TROPEL) at a light source wavelength of 633 nm. As a result, superior measurement sensitivity and measurement reproducibility are obtained.

(Fifth Embodiment)

The invention provides a method of manufacturing a mask corresponding to ArF excimer laser exposure light from among the halftone phase-shift masks of the invention.

A Ta—Hf film is grown to a thickness of 35 angstroms on a synthetic quartz substrate through use of a Ta—Hf alloy target while Ar, $O_2$, $N_2$ are taken as sputtering gases. Next, an MoSiON film is grown to a thickness of 900 angstroms through use of an MoSi target [Mo:Si=8:92 (atomic ratio)] and by taking Ar, $O_2$, $N_2$ as sputtering gases and regulating the flow rate of the gases such that a refractive index "n" of 2.04 and an extinction coefficient "k" of 0.29 are achieved at a wavelength of 193 nm. Through ESCA analysis, the composition of the MoSiON film obtained at this time is determined as 4.6 atm. % Mo, 29.9 atm. % Si, 39.5% O, and 26.0% N.

Figure 11:
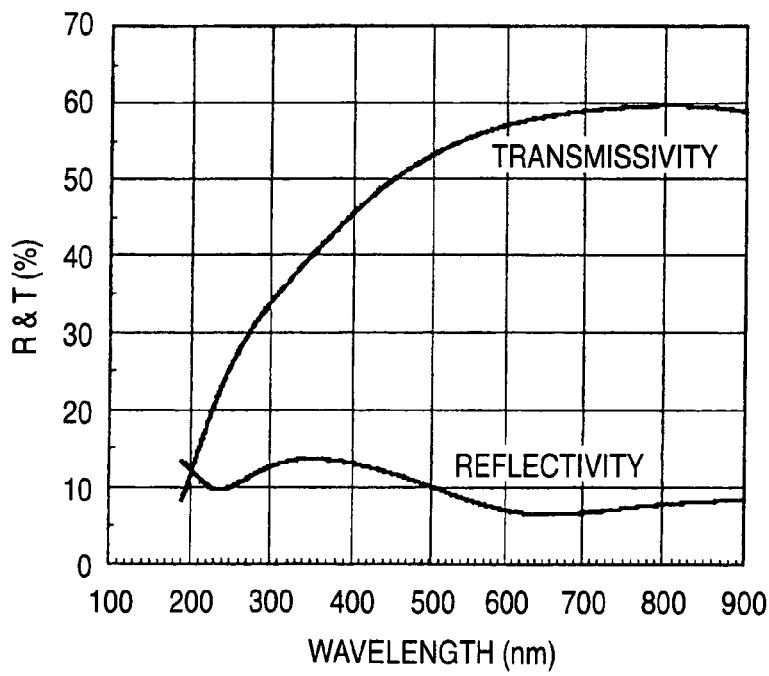
FIG. 11 is a view showing transmission/reflection spectra of a halftone-type phase-shift mask blank prepared in a fifth embodiment.

FIG. 11 shows transmission and reflection spectra of the phase shifter film formed through the foregoing film growth method. Variations in reflectivity of the phase shifter film are ascertained to fall within a value of 20% over a wide wavelength range of 180 nm to 900 nm. Naturally, variations in reflectivity are ascertained to fall within a value of 20% over the wavelength range of 193 nm to 700 nm. Optical transmissivity achieves a value of 15.2% at a wavelength of 193 nm, which is a wavelength of an ArF excimer laser.

Subsequently, the mask pattern and the opaque wash film are formed in the same manner as in the first embodiment, thereby producing a halftone phase-shift mask. A phase difference between the light transmission section of the mask and the phase shifter section is measured through use of a phase-contrast instrument. The resultant phase difference at the wavelength of the exposure light is 180°.

The halftone phase-shift mask obtained in the tenth embodiment is subjected to particle or defect inspections at light source wavelengths of 257 nm and 364 nm (Starlight, Terascan, or the like), and flatness measurement (TROPEL) at a light source wavelength of 633 nm. As a result, superior measurement sensitivity and measurement reproducibility are obtained.

By means of the configuration of the invention, the phase shifter section has at least one transmissivity adjustment layer having the function of primarily controlling transmissivity of exposure light, and at least one phase adjustment layer which primarily controls the phase of exposure light. A desired amount of carbon is introduced into the composition of the phase shifter film with reference to the material of the thin film used as the phase adjustment layer. In the multilayer structure of the phase adjustment layer, when the wavelength of the exposure light, the transmissivity of inspection light, and that of the alignment light, the inspection light and the alignment light, which are of longer wavelength than the exposure light, are controlled, effective attenuation in transmissivity of the phase adjustment layer at, particularly, the wavelength range of 240 nm to 650 nm or mitigation of dependence of variations in transmissivity at a wavelength can be achieved while a reduction in transmissivity at the wavelength of exposure light is suppressed slightly. Consequently, the transmissivity of the phase-shift mask with respect to the exposure light having a wavelength ranging from 140 nm to 200 nm and the transmissivity of inspection light and that of the alignment light, the inspection light and the alignment light being of longer wavelength than the exposure light, can be controlled.

The phase adjustment layer has the function of primarily adjusting a phase and also has the function of adjusting transmissivity. In contrast, the transmissivity adjustment layer has the function of primarily adjusting transmissivity and also has the function of adjusting a phase.

When the phase shift angle of the exposure light requested at a phase shifter film of the halftone-type phase-shift mask blank (a halftone-type phase-shift mask) is taken as A (deg.), there can be derived a relationship $$0 < \phi_2 < \phi_1 < A(\text{deg.}),$$

provided that the amount of phase shift in the exposure light caused by the phase adjustment layer is taken as φ1 and the amount of phase shift in the exposure light caused by the transmissivity adjustment layer is taken as ϕ2.

When there is employed a two-layer structure such that an upper layer performs the function for primarily adjusting the amount of phase shift (a phase adjustment layer) and such that a lower layer performs the function of primarily adjusting transmissivity, the phase shifter film is designed as follows.

Specifically, the amount of phase shift ϕ (deg.) in the exposure light of wavelength λ that passes through the upper layer (phase adjustment layer) is taken as ϕ1, the thickness "d" of the phase adjustment layer is expressed as $$d=(\phi1/360)\times\lambda/(n-1) \quad \text{(Eq. 3)},$$

where "n" represents a refractive index of the phase adjustment layer with reference to a wavelength λ.

The phase shifter film must be designed such that the amount of phase shift ϕ in the halftone phase-shifter section is expressed as $$\phi=\phi1+\phi2=A(\text{deg.}),$$

given that the amount of phase shift in a lower layer (transmissivity adjustment layer) is taken as ϕ2. The value of ϕ2 generally falls within the range of $-20°\leq\phi2\leq20°$. If the value falls outside the range, the lower layer becomes too thick, thereby obstructing an increase in transmissivity of the exposure light. For this reason, the thickness "d" of the upper layer is designed so as to fall within the range defined by the following equation.

$$0.44\times\lambda/(n-1)\leq d\leq 0.56\times\lambda/(n-1) \quad \text{(Eq. 4)}$$

The amount of phase shift in the halftone phase shifter film ideally assumes a value of 180°. The only practical requirement is that the amount of phase shift falls within a range of 180°±5°.

A thin film—which employs as a matrix component silicon such as silicon oxide, silicon nitride, or silicon oxynitride—is preferable as the phase adjustment layer, because the film is likely to achieve a comparatively high transmissivity at exposure light in an Ultraviolet region. These materials are easy to control in terms of a refractive index, and hence the phase adjustment layer is also superior in ease of control of the phase shift angle, which is the main function of the phase shifter. Further, the principal materials of the film are silicon oxide and silicon nitride, and hence the phase shifter film is also superior in chemical resistance. The silicon oxide, the silicon nitride, and the silicon oxynitride have an optical characteristic of a sharp fall in extinction coefficient and an increase in transmissivity from the neighborhood of a wavelength of 250 nm. For example, when a desired transmissivity of exposure light at a wavelength of 193.4 nm, which is a wavelength of an ArF excimer laser, is designed, there arises a problem of excessively high transmissivity or an excessively large difference between transmissivities of wavelengths being achieved at typical wavelengths used in the mask process and the transfer process, such as 257 nm, 364 nm, 488 nm, and 633 nm, which are higher than the wavelength of the ArF excimer laser. As a result, there arises a problem of failure of the phase-shift mask to be applicable in manufacturing processes. To solve the problems, a thin film which employs as a matrix component silicon such as silicon oxide, silicon nitride, or silicon oxynitride (i.e., a thin film containing silicon, oxygen, and/or nitrogen) is caused to contain carbon, thereby suppressing to a negligible level a decrease in the transmissivity at the wavelength of the exposure light. Particularly, the transmissivity of the phase adjustment layer within the wavelength range of 240 nm to 650 nm can be effectively attenuated, or dependence of variations of transmissivity on a wavelength can be mitigated.

A thin film containing silicon, oxygen and/or nitrogen, and carbon contains silicon within a content range of 10 atm. % to 60 atm. %, carbon within a content range of 5 atm. % to 70 atm. %, nitrogen within a content range of 0 atm. % to 80 atm. %, and oxygen within a content range of 0 atm. % to 60 atm. %. Preferably, a total of these contents accounts for at least 80% or more of the entire composition of the halftone-type phase shifter section. When silicon accounts for less than 10%, bonds existing between silicon and carbon, nitrogen, oxygen are few, thereby resulting in a failure to improve compactness of the phase shifter film. In contrast, when silicon accounts for 60% or more, an attenuation coefficient of silicon becomes noticeable, thereby posing difficulty in attainment of sufficient transmissivity. When carbon accounts for less than 5%, bonds existing between silicon and carbon become few. As a result, the phase shifter film becomes inferior in terms of chemical resistance. In contrast, when carbon accounts for 70% or more, a characteristic of carbon becomes dominant. As a result, deterioration in the quality of the phase shifter film due to ozone stemming from, e.g., exposure (at an ArF: 193 nm) to ultraviolet, becomes noticeable. In order to achieve transmissivity, nitrogen and oxygen must be used complementarily. If one of the two elements accounts for 0%, the other element must be added in order to compensate for the shortage.

Ideally, a lower limit of 10% is preferably set for nitrogen. If nitrogen accounts for a value of 80% or more, the proportion of silicon constituting the principal material of the film becomes smaller, thereby posing difficulty in obtaining a compact composition. When the phase shifter film contains at least one of oxygen and nitrogen, the film fails to achieve sufficient stability if oxygen accounts for 60% or more. Hence, defects arise, and a phase shifter film of superior quality cannot be obtained.

The thin film containing silicon, oxygen and/or nitrogen, and carbon may further include one type of material or two or more types of materials selected from the group consisting of metal, phosphor, and boron. Molybdenum, tungsten, tantalum, titanium, chromium, or other transition metals can also be enunciated as metal to be added. As a result of one type of material or two or more types of materials selected from the group consisting of metal, phosphor, and boron being added to the thin film, in particular an extinction coefficient can be increased for controlling an extinction coefficient of the phase adjustment layer. The content of the material is preferably 20 atm. % or less. If the content of the material is greater than that value, difficulty will be encountered in ensuring transmissivity in the range of short wavelength, thereby deteriorating chemical resistance. For similar reasons, the material content is preferably set to 10% or less, further preferably 5% or less.

In relation to a method for growing a film of phase adjustment layer, a sputtering method, a chemical vapor deposition (CVD) using heat or plasma, an ion beam deposition method, and an ion beam deposition (electron beam) evaporation method can be used as a common film growth method. Any one of the film growth methods may be basically adopted in accordance with the type and characteristic of a material or a desired film quality, as required. When the broadness of controllability of film quality and mass-production are taken into consideration, the sputtering method is currently preferable. In the case of a sputtering film growth method, a substantial film component can be determined by means of a combination of a target and a sputtering gas. The combination is multifaceted. For instance, when the film of the invention is produced, silicon or a target containing silicon (e.g., silicon and metal when the thin film contains metal) is used as a sputtering target. Further, a carbon-containing gas, e.g., methane, ethane, propane, ethylene, and acetylene; a nitrogen-containing gas, such as nitrogen, nitrogen monoxide, nitrogen dioxide, laughing gas, or ammonia gas; carbon monoxide and carbon dioxide, which simultaneously contain carbon and oxygen; and argon, xenon, helium, and a gas mixture thereof, can be used in combination as sputtering gas, as required. Further, a target containing carbon, a target containing silicon nitride, a target containing silicon carbide, or a composite target containing these targets can also be used. At that time, types of gases which enable addition of components appropriate to sputtering efficiency and a final target can be selected and used in combination. Further, only the requirement is to select a power application system employed at the time of sputtering operation, a sputter output, a gas pressure, and heating/non-heating of a substrate according to a film characteristic of an objective, as required.

A metal film formed from one type of material or two or more types of alloys selected from the group consisting of chromium, molybdenum, tantalum, titanium, tungsten, hafnium, zirconium, or oxides, nitrides, oxynitrides, and silicides of the metal or alloy can be enunciated as the material of the transmissivity adjustment layer.

When the phase adjustment layer contains nitrogen, the refractive index of the layer becomes larger, thereby rendering the phase shifter film thin and yielding an advantage in micromachinability. Moreover, high permeability is obtained as a result of the layer containing oxygen. In view of these effects, the phase adjustment layer is preferably formed into a film containing silicon, oxygen, nitrogen, and carbon. In view of stability of film growth and a reduction in film stress, the film is preferably grown by means of reactive sputtering using a carbon dioxide gas.

In the embodiment, the phase shifter film is not limited to a two-layer structure formed from a transmissivity adjustment layer and a phase adjustment layer. For instance, the phase shifter film includes a multilayer structure into which a transmissivity adjustment layer and a phase adjustment layer, for example, are stacked alternately.

A synthetic quartz substrate or the like can be used as the transparent substrate of the invention. Particularly, when the $F_2$ excimer laser is used as exposure light, the F-doped synthetic quartz substrate, a calcium fluoride substrate, or the like can be used.

An embodiment will now be described on the basis of a test performed for clarifying an effect of introduction of carbon.

(Sixth Embodiment)

Introduction of carbon into a film that employs silicon nitride as a matrix is reviewed in a sixth embodiment.

A sintered SiC target, which contains Si and C at a ratio of 1:1, is used as a target in d.c. reactive sputtering. With a view toward changing the composition of the phase shifter film, as required, small pieces (chips) formed from single silicon or carbon elements are provided in an area of the target to be sputtered. The composition of the phase shifter film is changed by changing an area ratio. Nitrogen is introduced into the sputtering gas at a ratio of 40 sccm. The base pressure of the sputtering apparatus is $1 \times 10^{-4}$ Pa or less, and the base pressure achieved during the course of sputtering operation is defined as $4 \times 10^{-1}$ Pa.

Figure 15:
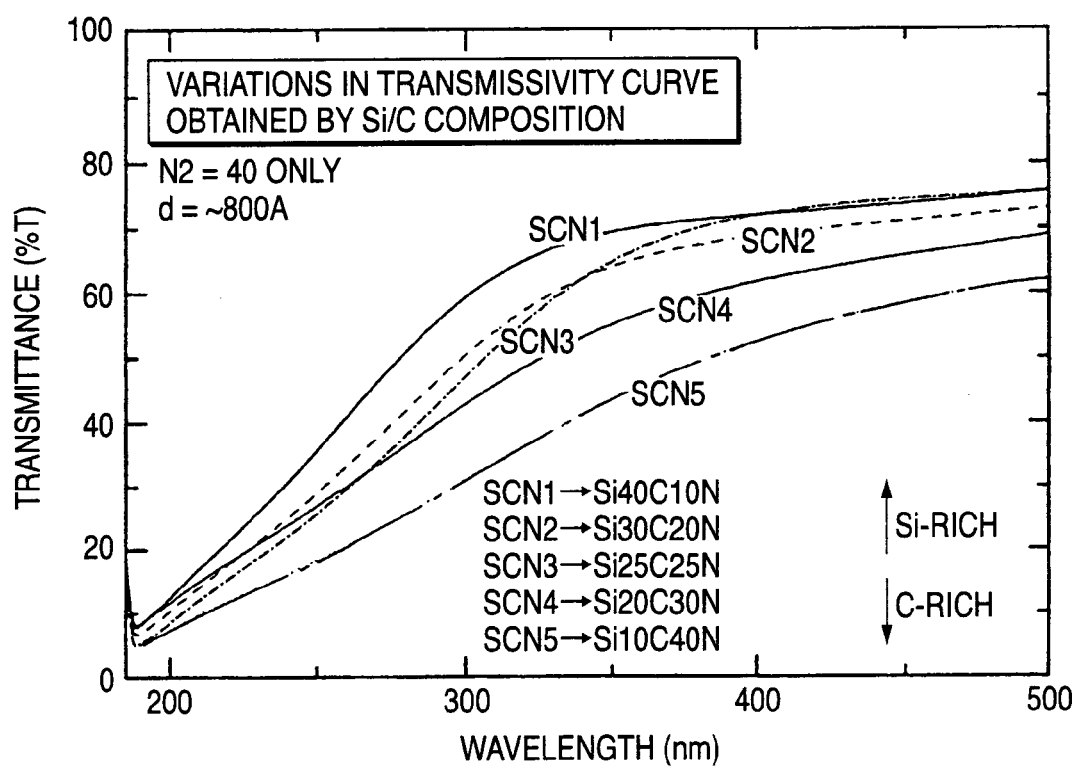
FIG. 15 is a view showing variations in a transmissivity characteristic of phase-shift film material showing a carbon introduction effect according to the first embodiment.

FIG. 15 shows transmissivity characteristics of various carbon-introduced silicon nitride films that had been prepared. For comparison, the thicknesses of the respective sample films are standardized to about 80 nm. As is evident from the results, the sample films containing a large amount of silicon from among the sample films achieve a high transmissivity over, particularly, a range of 250 nm to 500 nm. In contrast, as the carbon content in the film is increased, transmissivity starts attenuating from the neighborhood of, particularly, 300 nm to 350 nm, thereby suppressing an increase in transmissivity from the neighborhood of 250 nm. These samples have achieved an attenuation of about 5% in transmissivity at a wavelength of 193 nm. Particularly, the attenuation in transmissivity achieved in the vicinity of 300 nm is 30% or more. Accordingly, the transmissivity achieved at the wavelength employed in inspection or the like (e.g., 240 nm to 650 nm) can be understood to decrease while a reduction in transmissivity at the wavelength of the exposure light (i.e., 140 nm to 200 nm) is suppressed.

Even when the exposure light is set to 193 nm and the light used for inspection is set to 257 nm or 365 nm, transmissivity can be effectively attenuated while an attenuation in transmissivity is suppressed to a low level.

The refractive index of the phase shifter film is changed as a result of essential introduction of carbon into the phase shifter film, whereby the thickness for obtaining a phase angle required for the phase shifter film is changed. Accordingly, when a thin film formed essentially from silicon, nitride, and carbon, such as those mentioned above, is used as the phase adjustment layer of the phase shifter film in the halftone-type phase shift mask, the function of the phase shifter film of the halftone-type phase-shift mask can be achieved by adjusting the transmissivity and phase difference of the phase adjustment layer so as to assume desired values requested for the phase shifter film in conjunction with the transmissivity adjustment layer.

(Seventh Embodiment)

Introduction of carbon into a film that employs silicon oxide as a matrix is reviewed in a seventh embodiment.

A method for producing a film formed by introduction of carbon into silicon oxide is reviewed through use of a silicon target, and by changing a mixing ratio through fixing to 10 sccm the amount of nitrogen to be employed as a sputtering gas in d.c. reactive sputtering and setting a combined amount of carbon dioxide and carbon monoxide to 30 sccm.

The base pressure of the sputtering apparatus is $1 \times 10^{-4}$ Pa or less, and the base pressure achieved during the course of sputtering operation is defined as $4 \times 10^{-1}$ Pa.

Even in the case of the film produced in the second embodiment, a transmissivity around 250 nm to 650 nm can be effectively attenuated with a rise in the ratio of carbon in a partial pressure of a gas at the time of growth of a film. In addition, as a method for verifying the effect, a method—which introduces a nitrogen gas as a sputtering gas by arranging small pieces (chips) formed from single carbon elements on a target during RF reactive sputtering using a silicon oxide target—is also ascertained to yield the same effect.

Even in the seventh embodiment, when the thin film formed essentially from silicon, oxygen, and carbon is used as the phase adjustment layer of the phase shifter film of the halftone-type phase shift mask, the function of the phase shifter film of the halftone-type phase-shift mask can be achieved by adjusting the transmissivity and phase difference of the phase adjustment layer so as to assume desired values requested for the phase shifter film in conjunction with the transmissivity adjustment layer.

Even in the embodiment, desired transmissivity control can be effected by preparation of a phase adjustment film which is formed by introduction of carbon into the film, as in the case of the first embodiment.

(Eighth Embodiment)

Introduction of carbon into a film that employs as a matrix component silicon, nitrogen, and oxygen, which include metal elements, is reviewed in an eighth embodiment.

A method for producing a film is reviewed through use of a silicon target, and by changing a mixing ratio by fixing to 10 sccm the amount of nitrogen to be employed as a sputtering gas in d.c. reactive sputtering and setting a combined amount of carbon dioxide and carbon monoxide to 30 sccm.

The base pressure of the sputtering apparatus is $1 \times 10^{-4}$ Pa or less, and the base pressure achieved during the course of sputtering operation is defined as $4 \times 10^{-1}$ Pa.

Even in the case of this embodiment, a transmissivity around 250 nm to 650 nm can be effectively attenuated with a rise in the ratio of carbon in a partial pressure of a gas at the time of growth of a film.

Even in the eighth embodiment, when the thin film formed essentially from tantalum, silicon, oxygen, and carbon is used as the phase adjustment layer of the phase shifter film of the halftone-type phase shift mask, the function of the phase shifter film of the halftone-type phase-shift mask can be achieved by adjusting the transmissivity and phase difference of the phase adjustment layer so as to assume desired values requested for the phase shifter film in conjunction with the transmissivity adjustment layer.

Even in the embodiment, desired transmissivity control can be effected by preparation of a phase adjustment film which is formed by introduction of carbon into the film, as in the case of the first embodiment.

In the embodiment, the film growth is not limited to a method, and film growth is achieved by appropriately setting a film growth method, a target, the composition of a gas, and other film growth conditions.

In the invention, the phase shifter film is formed from a (upper) film (hereinafter called a "predetermined MSiOxNy film," as required) formed from, as primary constituent elements, metal, silicon, oxygen, and nitrogen; and an (lower) etch stopper film formed between the film and the transparent substrate. Here, in the film containing metal, silicon, oxygen, and nitrogen as primary constituent elements, an Si—N bond in SiNx makes the matrix of the film compact, and hence the film has high exposure resistance to exposure light and high chemical resistance to a cleaning solvent. Further, SiOx can have comparatively high transmissivity even in a shorter wavelength range. A refractive index can be made larger by inclusion of nitrogen and metal into the film. Hence, the thickness of the film can be made small, thereby achieving superior ease of patterning. Here, the metal content is set so as to account for 10 atm. % or less of the entire film. If the metal content accounts for a value greater than 10 atm. %, a film having high transmissivity cannot be obtained. Further, difficulty is encountered in achieving desired transmissivity over the wavelength range of 140 nm to 200 nm. In view of acquisition of a film having a higher transmissivity, a value of 6 atm. % or less is preferable, and a value of 5 atm. % or less is more preferable. A film containing metal can be grown by use of a target containing metal, thereby enhancing electrical conductivity of the target formed from silicon and metal. Therefore, easy assurance of stability in film growth during DC sputtering operation leads to a reduction in the number of particles arising. Further, the film containing metal can broaden (planarize) a reflection spectrum with respect to the wavelength of the phase shifter film. For these reasons, the metal-containing film is advantageous when there is a necessity for achieving reflectivity of predetermined range over a wide wavelength range. From this viewpoint, the metal content of the film is preferably set to 1 atm. % or more.

Further, transition metal is preferable as metal to be contained in a film formed from, as primary constituent elements, metal, silicon, oxygen, and nitrogen. Specifically, molybdenum, tungsten, tantalum, titanium, chromium, and other transition metals can also be enunciated as metal.

The halftone-type phase-shift mask and the halftone-type phase-shift mask blank, both pertaining to the invention, enable simultaneous control of a transmissivity and the amount of a phase shift, by primarily changing a composition ratio of oxygen to nitrogen. The transmissivity can be increased by increasing the amount of oxygen, and the refractive index can be increased by increasing the amount of nitrogen and metal. When the amount of metal is increased, the transmissivity is lowered. However, nitrogen enables an increase in refractive index without involvement of any substantial decrease in transmissivity.

Provided that a total content of silicon, nitrogen, and oxygen is taken as 100, a composition range of silicon, nitrogen, and oxygen is preferably set so as to assume 25 to 45 atm. % silicon, 1 to 60 atm. % oxygen, and 5 to 60 atm. % nitrogen. More specifically, if the silicon content is greater than a value of 45% or the nitrogen content is greater than a value of 60%, the optical transmissivity of the film becomes insufficient. Conversely, if the nitrogen content exceeds a value of 5% or the oxygen content exceeds a value of 60%, the function of the halftone-type phase shifter film is lost, because the optical transmissivity of the film is too high. If the silicon content exceeds a value of 25% or the nitrogen content exceeds a value of 60%, the structure of the film becomes physically and chemically very unstable.

The film comprising, as primary constituent elements, metal, silicon, oxygen, and nitrogen can be formed by sputtering a sputtering target including metal and silicon in a sputtering atmosphere containing a sputtering gas, such as argon or helium, and a reactive gas including oxygen and nitrogen. Use of the sputtering target containing metal and silicon ensures electrical conductivity of the target. Therefore, a reduction in the chance of occurrence of particles and stability of a grown film can be achieved by means of the DC sputtering method.

In order to ensure sufficient machining accuracy by means of etching a phase shift mask, anisotropic etching in at least a depthwise direction is required. For this reason, dry etching is used. The predetermined MSiOxNy film (upper layer) (M means metal, the same also applies to counterpart expressions in the subsequent descriptions) is usually subjected to RIE (Reactive Ion Etching) in a fluoride gas such as $CHF_3$, $CF_4$, $SF_6$, $C_2F_6$ or a gas mixture thereof.

Most current mask boards are synthetic quartz substrates. Etch rate of synthetic quartz to the fluoride gas is comparatively large. Therefore, under the assumption that an attempt is made to manufacture a phase-shift mask of single layer structure having a phase shifter film of single layer provided on a transparent substrate, the phase shifter film being formed from the previously-described predetermined MSiOxNy film, and that etching is continued even after etching of the phase shifter film has been completed, the substrate is etched, and the phase difference becomes greater than 180°. Therefore, an improvement in resolution owing to a phase shift cannot be achieved.

In order to prevent this, the end point of the phase-shift mask must be determined during the etching process. Several determination methods have already been proposed. Among the methods, the most common and effective method is to expose a section to be etched to light of a specific wavelength (e.g., 680 nm) and to detect variations in the intensity of reflected light changing over time, thereby determining an end point.

However, when the predetermined MSiOxNy film has the metal content falling within the foregoing range, the film becomes analogous to the synthetic quartz substrate in terms of composition and refractive index. Hence, even when etching of the section to be etched has proceeded, sufficient variations in reflection intensity may fail to be attained. This can be responsible for causing a problem in the machining precision in a depthwise direction of the phase shifter film.

In the phase-shift mask and the phase-shift mask blank, both pertaining to the invention, an etch stopper film is provided between the predetermined MSiOxNy film and the synthetic quartz substrate. In this case, the phase-shifter film assumes a two-layer structure consisting of the predetermined MSiOxNy film and the etch stopper film. After the phase-shifter film has been formed into the two-layer structure, a predetermined phase angle and transmissivity are adjusted.

Here, the etch stopper layer is a film formed from material having the function of stopping progress in etching of the predetermined MSiOxNy film, a film formed from material having the function of facilitating detection of an end point of etching of the phase shifter film, or a film formed from material having both functions.

In connection with the film having the function of stopping a progress in etching of the predetermined MSiOxNy film, the film is formed from material having low etch selectivity to etching of the predetermined MSiOxNy film; that is, material whose etch rate to an etching medium used in etching the predetermined MSiOxNy film is lower than that of the predetermined MSiOxNy film. More specifically, a film having the function of stopping progress in etching of the predetermined MSiOxNy film is preferably formed from material which has an etch selectivity of 0.7 or less, more preferably 0.5 or less, to the predetermined MSiOxNy film. In connection with the latter etch stopper film having the function of facilitating detection of an end point of etching of the phase shifter film, the film is formed from such a material that a difference in reflectivity between the transparent substrate (e.g., a synthetic quartz substrate) and the light (e.g., 680 nm) employed for detecting an end point of etching of the etch stopper becomes greater than a difference in reflectivity between the transparent substrate and the predetermined MSiOxNy film. Preferably, the material is higher in refractive index (the real part of a complex refractive index) from the predetermined MSiOxNy film and the transparent substrate. Specifically, a preferable film is formed from material which achieves a refractive index difference of 0.5 or more, more preferably, one or more, between the predetermined MSiOxNy film and the light employed for detecting an end point of etching of the etch stopper. A preferable film is formed from material which achieves a refractive index difference of 0.5 or more, more preferably one or more, between the transparent substrate and the predetermined MSioxNy film.

The etch stopper film has an etch selectivity of 1.5 or J more, more preferably 2.0 or more, to a substrate. More specifically, if the etch stopper layer cannot be eliminated, the optical transmissivity of the light transmission section is lowered. As a matter of course, contrast achieved at the time of transfer of a pattern is deteriorated. Even if the etch stopper layer can be eliminated, the substrate may be etched in the vicinity of an end point of etching, so long as the etch stopper layer is greater in etch rate than the substrate, thereby deteriorating machining precision.

In consideration of the foregoing points, enunciated as suitable materials are one type of material or two or more types of materials selected from the group consisting of magnesium, aluminum, titanium, vanadium, chromium, yttrium, zirconium, niobium, molybdenum, zinc, lanthanum, tantalum, tungsten, silicon, hafnium, and compounds thereof (oxides, nitrides, or oxynitrides).

Preferably, the etch stopper film has a thickness of 5 to 200 angstroms. If the etch stopper film has a thickness of five angstroms or less, etching cannot be stopped completely, or a significant variation in reflectivity arises. For these reasons, patterning accuracy may be deteriorated. Depending on an etching process, enlargement of a pattern stemming from isotropic etching proceeds to a maximum of about twice the thickness of the film. Accordingly, if the thickness of the film exceeds 200 angstroms when a pattern line has a width of 0.1 $\mu$m=1000 angstroms or less, a dimensional error of 40% or more arises, thereby inflicting serious adverse effect on the quality of the mask.

Moreover, the etch stopper layer preferably has the function of adjusting transmissivity. The transmissivity of the etch stopper layer to the wavelength of the exposure light (e.g., a wavelength range of 140 to 200 nm, a wavelength around 157 nm, or a wavelength around 193 nm) is set to 3 to 40%. As a result, the transmissivity of inspection wavelength longer than the wavelength of the exposure light can be diminished by means of the etch stopper layer (different multilayered materials) formed in a lower portion of the phase shifter section while the transmissivity obtained at the phase shifter section is maintained. More specifically, a mask is currently inspected during manufacturing processes, through use of light which is longer in wavelength than exposure light, thereby measuring the intensity of transmitted light. The optical transmissivity of the semi-optical transmission section (a phase shifter section) is desirably considered to assume a value of 40% or less within the current inspection wavelength range of 200 to 300 nm. If the optical transmissivity is 40% or more, contrast to the optical transmission section is not ensured, thereby deteriorating inspection accuracy. When the etch stopper film is formed from material having a high opaque function, a film formed from one type of material or two or more types of materials selected from the group consisting of aluminum, titanium, vanadium, chromium, yttrium, zirconium, niobium, molybdenum, zinc, lanthanum, tantalum, tungsten, silicon, hafnium, and nitrides thereof are enunciated. The etch stopper film is desirably introduced while having a thickness sufficiently smaller than that of the phase shifter section. A thickness of 200 angstroms or less is appropriate. Specifically, when the thickness of the etch stopper layer exceeds 200 angstroms, the optical transmissivity at the wavelength of exposure light has a high probability of falling below 3%. When the etch stopper layer has the function of adjusting transmissivity, a phase angle and transmissivity are adjusted by means of two layers; that is, the predetermined MSiOxNy film and the etch stopper film. Specifically, transmissivity of the etch stopper to the wavelength of exposure light (a wavelength of 140 to 200 nm, a neighborhood of 157 nm, or a neighborhood of 193 nm) is preferably adjusted to 3 to 40%. Further, adjustment is preferably performed such that the transmissivity assumes a value of 3 to 40% when the etch stopper layer is stacked on the MSiOxNy film. When the etch stopper film is provided, an etch stopper layer exposed on an area of the surface corresponding to the light transmission section must be eliminated. The reason for this is that, when the etch stopper layer covers the light transmission section, a decrease arises in the transmissivity of the light transmission section. When the etch stopper film is formed from material having the function of stopping a progress in etching of the predetermined MSiOxNy film, a method differing from the method of etching the predetermined MSiOxNy film must be used as a method for eliminating an etch stopper. Further, when the etch stopper film is formed from material having the function of facilitating detection of an end point of etching of the phase shifter film, a method for etching the predetermined MSiOxNy film and a method for etching the etch stopper film may be identical with each other or may differ from each other. The predetermined MSiOxNy film can be etched through dry etching (Reactive Ion Etching: RIE) in, e.g., $CHF_3$, $CF_4$, $SF_6$, and $C_2F_6$ or the like. When the etch stopper film is etched away by a method differing from that employed for removing the predetermined MSiOxNy film, dry etching using a fluorine-based gas differing from that used for removing the predetermined MSiOxNy film or dry etching using a chlorine-based gas, e.g., ($Cl_2$, $Cl_2+O_2$), or wet etching using an acid or alkali can be used.

For example, silicon, MoSix, or TaSix, can be enunciated as a preferable material which can be removed through fluorine-based dry etching identical with that employed for etching the predetermined MSiOxNy film. In this way, when an etch stopper film which can be etched continuously with the predetermined MSiOxNy film is provided, a large process merit is yielded. For instance, Ta which can be dry-etched in $Cl_2$; a thin film containing Ta, TaNx, TaZr, TaCrx, TaHfx, Zr, Hf; or Cr which can be dry-etched in, for example, $Cl_2+O_2$, can be mentioned as a material for an etch stopper film which can be etched in a manner different from the manner used for etching the predetermined MSiOxNy film.

When the etch stopper film is formed from material having the function of stopping a progress in etching the predetermined MSiOxNy film and having high transmissivity, an etch stopper film is provided between the transparent substrate of the single-layer halftone-type phase-shift mask formed from the predetermined MSiOxNy film and the semi-optical transmission film, thereby preventing elimination of an etch stopper exposed in the light transmission section.

A synthetic quartz substrate or the like can be used as the transparent substrate of the invention. Particularly, when an $F_2$ excimer laser is used as exposure light, an F-doped synthetic quartz substrate, a calcium fluoride substrate, or the like can be used.

A ninth embodiment of the invention will now be described.

(Ninth Embodiment)

The embodiment shows a method for manufacturing a mask compatible with ArF excimer laser exposure light from among the halftone-type phase-shift masks of the invention.

A Ta—Hf film (a lower layer) is grown to a thickness of 35 angstroms on a synthetic quartz substrate through use of a Ta—Hf alloy target [Ta:Hf=9:1 (atomic ratio)] while Ar is taken as a sputtering gas. Next, an MoSiON film (an upper layer) is grown to a thickness of 900 angstroms through use of an MoSi target [Mo:Si=8:92 (atomic ratio)] and by taking Ar, $O_2$, and $N_2$ as sputtering gases and regulating the flow rate of the gases such that a refractive index of 2.04 and an extinction coefficient "k" of 0.29 are achieved at a wavelength of 193 nm. Through ESCA analysis, the composition of the MoSiON film (upper layer) obtained at this time is determined as 4.6 atm. % Mo, 29.9 atm. % Si, 39.5% 0, and 26.0% N.

Figure 16:
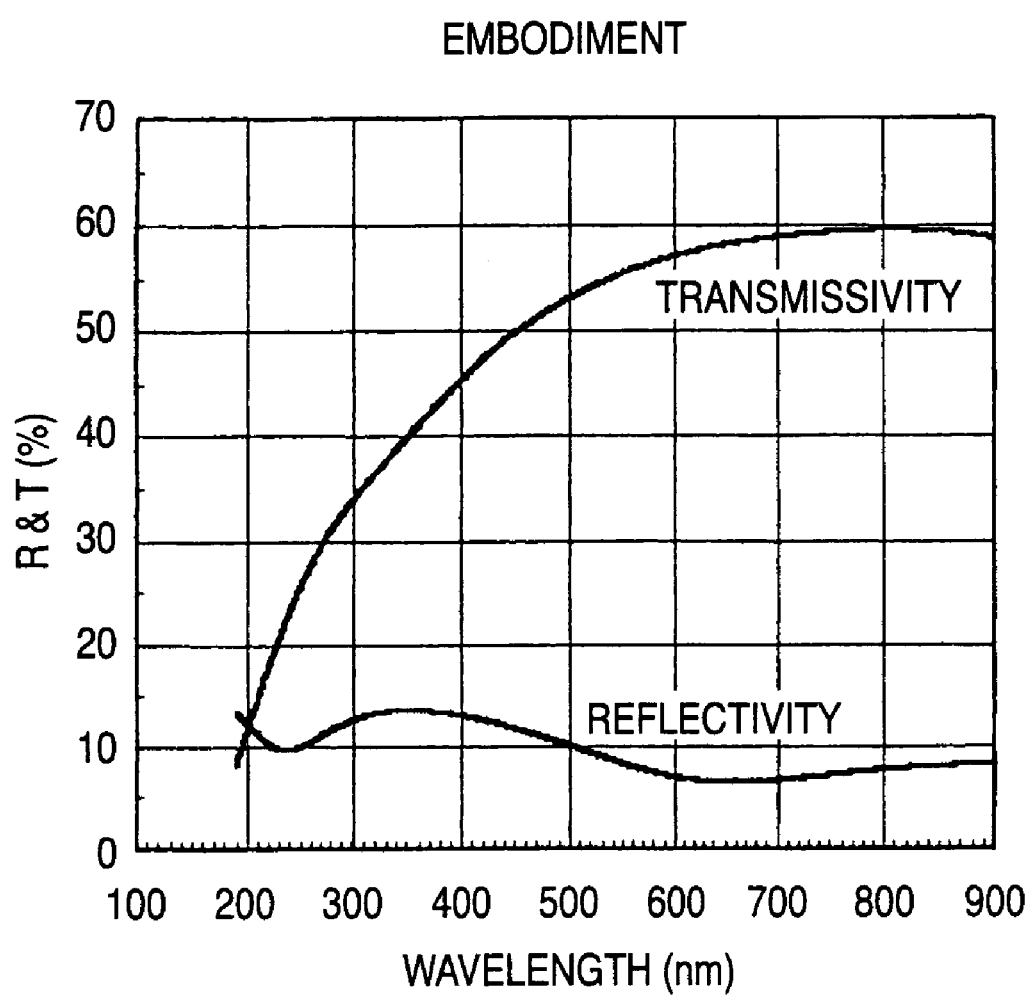
FIG. 16 is a view showing transmission/reflection spectra of a halftone-type phase-shift mask blank prepared in a sixth embodiment.

FIG. 16 shows transmission and reflection spectra of the phase shifter film formed through the foregoing film growth method. The reflectivity of the phase shifter film is ascertained to achieve 15.2% at the wavelength of ArF excimer laser; that is, 193 nm. Further, a transmissivity of 27% is achieved at the inspection wavelength (257 nm).

The sample is immersed in hydrated sulfuric acid ($H_2S_4$+$H_2O_2$) and hydrated ammonia ($NH_3aq+H_2O_2$) for an hour. No change in transmissivity is detected by a spectrophotometer, whereby the produced sample is ascertained to have high chemical resistance.

Figure 17:
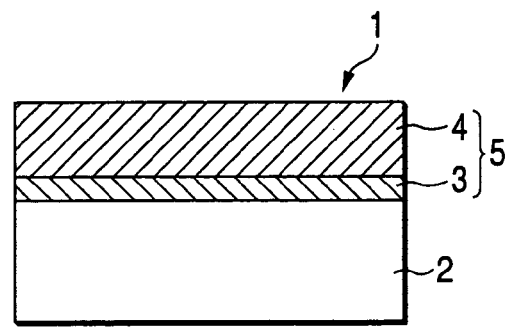
FIGS. 17A–17D are charts pertaining to a process of manufacturing the halftone-type phase-shift mask blank and the halftone-type phase-shift mask according to the embodiment of the invention.
Figure 17:
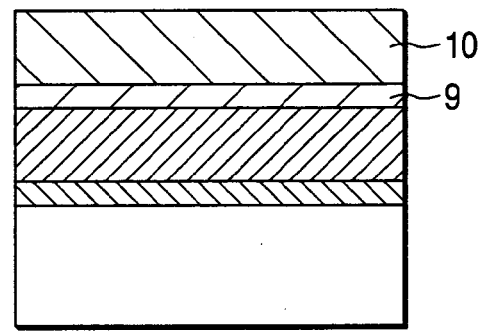
Figure 17:
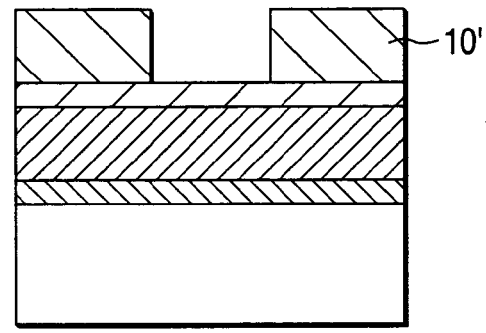
Figure 17:
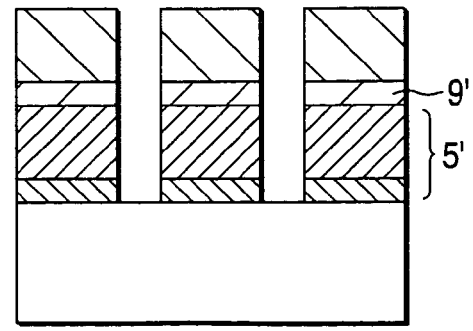

As shown in FIG. 17-1, the phase shifter film 5, which is formed from the lower layer 3 made of Ta—Hf and the upper layer 4 made of MoSiON, is placed on the transparent substrate 2 made of a synthetic quartz substrate. The opaque ring film 9 containing chromium as a primary component and the electron beam lithography resist 10 are sequentially stacked on the phase shifter film 5 (FIG. 17-2). After a pattern has been drawn on the resist 10 by means of the electron beam, the substrate is immersed in a developing solution and then baked, thereby forming the resist pattern 10' (FIG. 17-3). Subsequently, the opaque ring film pattern 9' is formed through dry etching in a $Cl_2+O_2$ gas or the like while the resist pattern 10' is used as a mask (FIG. 17-4). In addition, a pattern of the phase shifter section is formed by changing a gas (FIG. 17-4). At that time, a $CF_4+O_2$ gas is used for etching the upper layer 4, and a $Cl_2$ gas is used for etching the lower layer 3. Endpoints of etching are detected by means of the reflection optical system. End points of the respective layers are determined by means of points of inflection of a reflected light intensity profile. Through observation of cross-sectional profile of the patterned phase shifter film, a vertical cross section is observed.

Figure 18:
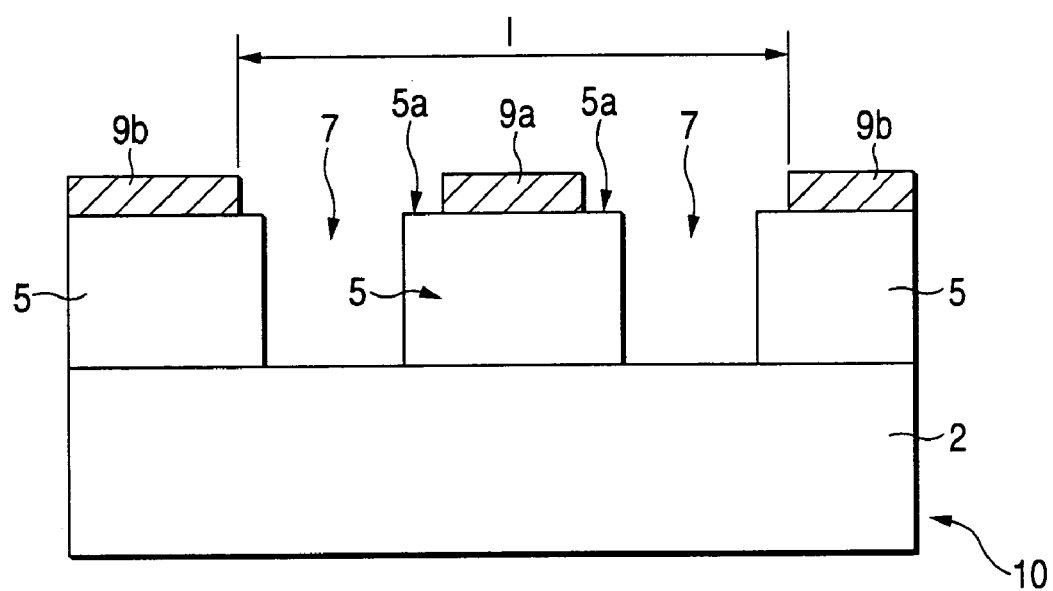
FIG. 18 is a schematic representation for describing one mode of the halftone-type phase shift mask.

Next, the resist formed on the pattern is exfoliated, and the resist is a gain applied over the entire surface of the pattern. The resist is then subjected to a lithography-and-development process, thereby forming a resist pattern (not shown) such that the opaque ring pattern 9b is formed along the periphery of the mask pattern and the opaque layer 9a in a desired area except the neighborhoods of boundaries between the halftone phase shifter sections 5 and the light transmission sections 7 (see FIG. 18). By means of wet etching or dry etching, Cr is removed with the exception of Cr located below the opaque ring patterns 9b and the opaque layer 9a, thereby producing a halftone-type phase-shift mask (see FIG. 18). A phase difference between the light transmission section of the mask and the phase shifter section is measured through use of a phase-contrast instrument. The resultant phase difference at the wavelength of the exposure light is 180°.

In the embodiment, the highly-transmissive halftone-type phase-shift mask blank for an ArF excimer laser and the highly-transmissive halftone-type phase-shift mask for an ArF excimer laser are manufactured. A halftone-type phase-shift mask blank for an $F_2$ excimer laser and a halftone-type phase-shift mask for an $F_2$ excimer laser can also be manufactured.

Further, according to the invention, a halftone-type phase-shift mask blank or mask which can reduce a surface reflectivity at a desired wavelength can be manufactured by reducing the thickness of the transmissivity adjustment layer to 90 angstroms or less.

The invention enables manufacture of a halftone-type phase-shift mask blank or mask which enables attainment of a desired surface reflectivity by suppressing variations in reflectivity over a wide wavelength range from the wavelength of exposure light to 700 nm. In particular, there can be obtained a halftone-type phase-shift mask blank and a halftone-type phase-shift mask, which are compatible with a wavelength range of ArF to vacuum ultraviolet exposure light (i.e., a wavelength of 140 nm to 200 nm) and can be suitably used for a system which uses a plurality of wavelengths longer than the wavelength of exposure light.

As has been described in detail, carbon is contained in the phase adjustment layer of the phase shifter layer in each of the halftone-type phase-shift mask blank and the halftone-type phase-shift mask. As a result, when the wavelength of exposure light, the transmissivity of inspection light whose wavelength is longer than that of the exposure light, and the transmissivity of alignment light are controlled, a reduction in transmissivity at the wavelength of the exposure light is suppressed to a slight level. Particularly, the transmissivity of the phase adjustment layer within the wavelength range of 240 nm to 650 nm can be effectively attenuated, or dependence of variations in transmissivity on a wavelength can be lessened. Consequently, there can be provided a halftone-type phase-shift mask blank and a halftone-type phase-shift mask, which are compatible with shortening of wavelength of the exposure light (i.e., the wavelength range of 140 nm to 200 nm) and can be applied to various inspection light sources and alignment light sources used in a blank manufacturing process, a mask manufacturing process, and a wafer transfer process.

Further, the invention can provide a halftone-type phase-shift mask blank and a halftone-type phase-shift mask, which are compatible with shortening of wavelength of the exposure light (i.e., the exposure wavelength range of 140 nm to 200 nm) and an increase in transmissivity of the exposure light (a transmissivity of 8 to 30%) and has high machining precision.

What is claimed is:

1. A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter, wherein the phase shifter film has a phase adjustment layer comprising silicon oxynitride for primarily controlling the phase of the exposure light, and a transmissivity adjustment layer having the function of primarily controlling transmissivity of the exposure light formed between the transparent substrate and a phase adjustment layer; and the transmissivity adjustment layer has a thickness of 90 angstroms or less.

2. The halftone-type phase-shift mask blank according to claim 1, wherein the transmissivity adjustment layer has an etch selectivity of five or more to the transparent substrate.

3. The halftone-type phase-shift mask blank according to claim 1, wherein the transmissivity adjustment layer has an etch selectivity of five or more to the transparent substrate when the transparent substrate is subjected to dry etching through use of a chlorine-based gas.

4. A halftone-type phase-shift mask manufactured through use of the halftone-type phase-shift mask blank defined in any one of claims 1 through 3.

5. A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein a range of variations in surface reflectivity of the phase shifter film is 20% or less over a range from a wavelength of the exposure light to 700 nm.

6. The halftone-type phase-shift mask blank according to claim 5, wherein the phase shifter film has a phase adjustment layer for primarily controlling a phase of exposure light, and a transmissivity adjustment layer which is formed between the transparent substrate and the phase adjustment layer and has a function of controlling transmissivity of the exposure light.

7. The halftone-type phase-shift mask blank according to claim 5, wherein the phase shifter film further has a reflection adjustment layer provided at the highest layer.

8. The halftone-type phase-shift mask blank according to claim 6, wherein the phase adjustment layer of the phase shifter film includes metal, silicon, oxygen, and/or nitrogen.

9. A halftone-type phase-shift mask blank for use in manufacturing a halftone-type phase-shift mask, the mask including a light transmission section which is provided on a transparent substrate and enables transmission of exposure light, and a phase shifter section which enables transmission of a portion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein the phase shifter film has a phase adjustment layer for primarily controlling a phase of exposure light, and a transmissivity adjustment layer which is formed between the transparent substrate and the phase adjustment layer and has a function of controlling transmissivity of the exposure light; and wherein the phase shifter film also has a reflection adjustment layer provided at the highest layer.

10. A halftone-type phase-shift mask manufactured through use of the halftone-type phase-shift mask blank defined in any one of claims 5 through 9.

11. A halftone-type phase-shift mask blank for use in manufacturing a halftone-type phase-shift mask, the mask being used in exposing and transferring a fine pattern and including a light transmission section which enables transmission of exposure light, and a phase shifter section which shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted through the phase shifter section cancel each other in the vicinity of the boundary section between the light transmission section and the phase shifter; and the mask blank having a phase shifter film to be used for forming the phase shifter section on the transparent substrate, wherein the phase shifter section has at least one transmissivity adjustment layer having the function of primarily controlling transmissivity of exposure light, and at least one phase adjustment layer which primarily controls the phase of exposure light; and the phase adjustment layer is formed from material including at least carbon.

12. The halftone-type phase-shift mask blank according to claim 10, wherein the material including carbon contains silicon and oxygen and/or nitrogen.

13. The halftone-type phase-shift mask blank according to claim 12, wherein the material including carbon further contains one type or two or more types of materials selected from the group consisting of metal, phosphor, and boron.

14. A halftone-type phase-shift mask obtained by processing, into a desired pattern, a phase shifter film of the halftone-type phase-shift mask blank defined in anyone of claims 11 through 13.

15. A halftone-type phase-shift mask blank for use in manufacturing a halftone-type phase-shift mask, the mask including a light transmission section which is provided on a transparent substrate and enables transmission of exposure light, and a phase shifter section which enables transmission of aportion of the exposure light and concurrently shifts the phase of the transmitted light by a predetermined amount, and the mask being able to excellently retain and improve contrast of a boundary section of an exposure pattern transferred onto a surface of a substance to be exposed, by virtue of an optical characteristic of the mask being designed such that light transmitted through the light transmission section and light transmitted Through the phase shifter section cancel each other in the vicinity of the boundary section between the light transmission section and the phase shifter; and the mask blank having a phase shifter film to be used for forming the phase shifter section on the transparent substrate, wherein the phase shifter film is formed from a film which contains 10 atm. % or less of molybdenum and is made primarily of molybdenum, silicon, oxygen, and nitrogen, and an etch stopper film formed between the film and the transparent substrate, wherein optical transmissivity falls within a value in a range from 8% to 30% to an ArF excimer laser having the wavelength of 193 nm.

16. The halftone-type phase-shift mask blank according to claim 15, wherein the etch stopper film is formed from material which can be etched through use of an etching medium differing from that used for etching the film formed primarily from metal, silicon, oxygen, and nitrogen.

17. The halftone-type phase-shift mask blank according to claim 15, wherein the etch stopper film is formed from material which can be etched through use of an etching medium identical with that used for etching the film formed primarily from metal, silicon, oxygen, and nitrogen.

18. The halftone-type phase-shift mask blank according to claim 15, wherein the phase-shift mask is used within an exposure light wavelength range of 140 to 200 nm.

19. A halftone-type phase-shift mask having a mask pattern formed by subjecting a phase shifter film of the halftone-type phase-shift mask blank defined in any one of claims 15 to 18 to patterning operation for selectively eliminating the phase shifter film so as to obtain a predetermined pattern.

20. A pattern transfer method for transferring a pattern through use of the halftone phase-shift mask defined in claim 19.

* * * * *